(12) United States Patent
Yoo et al.

(10) Patent No.: US 11,861,116 B2
(45) Date of Patent: Jan. 2, 2024

(54) DISPLAY DEVICE AND TOUCH INPUT SYSTEM INCLUDING THE SAME

(71) Applicant: SAMSUNG DISPLAY CO., LTD., Yongin-si (KR)

(72) Inventors: Gi Na Yoo, Cheonan-si (KR); Ju Yeon Kim, Asan-si (KR); Won Sang Park, Yongin-si (KR); Chang Woo Shim, Cheonan-si (KR); Seong Jun Lee, Seoul (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 17/823,114

(22) Filed: Aug. 30, 2022

(65) Prior Publication Data

US 2023/0229270 A1 Jul. 20, 2023

(30) Foreign Application Priority Data

Jan. 14, 2022 (KR) .......................... 10-2022-0005973

(51) Int. Cl.
| | |
|---|---|
| *G06F 3/044* | (2006.01) |
| *G06F 3/0354* | (2013.01) |
| *G06F 3/041* | (2006.01) |
| *H10K 50/86* | (2023.01) |
| *H10K 59/38* | (2023.01) |
| *H10K 59/40* | (2023.01) |

(52) U.S. Cl.
CPC .......... *G06F 3/0441* (2019.05); *G06F 3/0446* (2019.05); *H10K 50/865* (2023.02); *H10K 59/38* (2023.02); *H10K 59/40* (2023.02); *G06F 2203/04112* (2013.01)

(58) Field of Classification Search
CPC ................ G06F 3/0441; G06F 3/0446; G06F 2203/04112; H10K 59/40; H10K 59/38; H10K 50/865
See application file for complete search history.

(56) References Cited

U.S. PATENT DOCUMENTS

| | | | |
|---|---|---|---|
| 2018/0157341 A1* | 6/2018 | Oda ........................ | G06F 3/038 |
| 2021/0055828 A1* | 2/2021 | Miyamoto ............ | G06F 3/0441 |

FOREIGN PATENT DOCUMENTS

| | | |
|---|---|---|
| KR | 10-2012-0110817 | 10/2012 |
| KR | 10-2017-0109184 | 9/2017 |
| KR | 10-2019-0137203 | 12/2019 |
| KR | 10-2020-0117080 | 10/2020 |
| KR | 10-2023-0016737 | 2/2023 |

* cited by examiner

*Primary Examiner* — Deeprose Subedi
(74) *Attorney, Agent, or Firm* — F. Chau & Associates, LLC

(57) ABSTRACT

A display device includes a display unit including a plurality of emission areas, a plurality of touch electrodes that sense a touch, a plurality of code patterns that cover a part of a front surface of at least one of the plurality of touch electrodes, and a plurality of light-blocking dummy patterns formed on some of the plurality of touch electrodes on which the plurality of code patterns is not formed. Each of the touch electrodes includes at least one portion disposed between adjacent emission areas among the plurality of emission areas. A thickness of the plurality of code patterns is different from a thickness of the light-blocking dummy patterns, and a light-blocking rate of the plurality of code patterns is different from a light-blocking rate of the light-blocking dummy patterns.

20 Claims, 22 Drawing Sheets

DISPLAY DEVICE AND TOUCH INPUT SYSTEM INCLUDING THE SAME

CROSS-REFERENCE TO RELATED APPLICATIONS

This application claims priority under 35 U.S.C. § 119 to Korean Patent Application No. 10-2022-0005973, filed on Jan. 14, 2022 in the Korean Intellectual Property Office, the disclosure of which is incorporated by reference herein in its entirety.

TECHNICAL FIELD

Embodiments of the present disclosure relate to a display device and a touch input system including the same.

DISCUSSION OF RELATED ART

As society becomes more information oriented, the demand for improved display devices is increasing. For example, display devices are being employed by a variety of electronic devices such as smartphones, digital cameras, laptop computers, navigation devices, and smart televisions. Display devices may be flat panel display devices such as, for example, a liquid-crystal display device, a field emission display device, and an organic light-emitting display device. Among such flat panel display devices, a light-emitting display device includes a light-emitting element that can emit light on its own, so that each of the pixels of the display panel, which respectively includes a light-emitting element, can emit light on its own. Accordingly, a light-emitting display device can display images without a backlight unit that supplies light to the display panel.

A display device may support a touch input using a part of a user's body (e.g., a finger) and a touch input using an electronic pen. By sensing a touch input with an electronic pen, the display device can sense the touch input more precisely than a display device that senses a touch input using only a part of the user's body.

SUMMARY

Aspects of the present disclosure provide a display device capable of performing a touch input by a touch input device using code patterns of a display panel, and a touch input system including the same.

Aspects of the present disclosure also provide a display device capable of increasing the recognition rate of code patterns based on the configuration of the thickness and the inclinations of the code patterns, and a touch input system including the same.

According to an embodiment of the disclosure, a display device includes a display unit including a plurality of emission areas, and a plurality of touch electrodes that sense a touch. Each of the plurality of touch electrodes includes at least one portion disposed between adjacent emission areas among the plurality of emission areas. The display device further includes a plurality of code patterns that cover a part of a front surface of at least one of the plurality of touch electrodes, and a plurality of light-blocking dummy patterns formed on some of the plurality of touch electrodes on which the plurality of code patterns is not formed. A thickness of the plurality of code patterns is different from a thickness of the light-blocking dummy patterns, and a light-blocking rate of the plurality of code patterns is different from a light-blocking rate of the light-blocking dummy patterns.

In an embodiment, the plurality of touch electrodes includes a plurality of driving electrodes, a plurality of sensing electrodes and a plurality of dummy electrodes, and the plurality of driving electrodes, the plurality of sensing electrodes and the plurality of dummy electrodes are formed in a mesh structure between the plurality of emission areas.

In an embodiment, a shape of each of the plurality of code patterns when viewed in a plan view is one of a closed loop shape of at least one of a rectangle, a square, a circle and a diamond, an open loop shape partially surrounding at least one of the plurality of emission areas, and a straight line shape having a predetermined length.

In an embodiment, the plurality of code patterns and the plurality of light-blocking dummy patterns include an inorganic or organic black pigment that absorbs infrared or ultraviolet light, and cover a part of the front surface and a side surface of the at least one of the plurality of touch electrodes such that the plurality of code patterns and the plurality of light-blocking dummy patterns do not overlap the plurality of emission areas.

In an embodiment, the light-blocking dummy patterns are formed in a mesh shape between the plurality of emission areas such that the plurality of light-blocking dummy patterns and the plurality of code patterns do not overlap the plurality of emission areas.

In an embodiment, the thickness of the code patterns is greater than the thickness of the light-blocking dummy patterns, and slopes with predetermined inclinations are formed on side and front surfaces of each of the code patterns.

In an embodiment, each of the light-blocking dummy patterns has a slope on at least one side surface and a flat front surface thereof, and each of the code patterns has a first slope with a first inclination on a front surface and has a second slope with a second inclination on at least one side surface thereof.

In an embodiment, the code patterns have a diffuse reflectance higher than a diffuse reflectance of the light-blocking dummy patterns.

In an embodiment, a width of the light-blocking dummy patterns is about equal to a width of the code patterns, and the thickness of the code patterns is greater than the thickness of the light-blocking dummy patterns, and the light-blocking rate of the code patterns is greater than that the light-blocking rate of the light-blocking dummy patterns.

In an embodiment, at least one side surface of each of the code patterns has a slope with a first inclination with respect to a plane, and a front surface of each of the code patterns has a slope with a second inclination with respect to the plane.

In an embodiment, the code patterns have a side slope with a first inclination, and a front slope with a second inclination, and the code patterns refract and diffusely reflect infrared light incident from a front side of the code patterns toward other sides of the code patterns.

In an embodiment, the plurality of code patterns and the light-blocking dummy patterns are formed as transparent or semi-transparent light-blocking members containing a transparent or semi-transparent pigment.

In an embodiment, the display unit further includes a plurality of color filter layers formed on the plurality of code patterns and the light-blocking dummy patterns, and covering the plurality of code patterns and the light-blocking dummy patterns.

According to an embodiment of the disclosure, a touch input system includes a display device that displays an image, and a touch input device that receives a touch input.

The display device includes a display unit including a plurality of emission areas, and a plurality of touch electrodes that sense a touch. Each of the plurality of touch electrodes includes at least one portion disposed between adjacent emission areas among the plurality of emission areas. The display device further includes a plurality of code patterns that cover a part of a front surface of at least one of the plurality of touch electrodes, and a plurality of light-blocking dummy patterns formed on some of the plurality of touch electrodes on which the plurality of code patterns is not formed. A thickness of the plurality of code patterns is different from a thickness of the light-blocking dummy patterns, and a light-blocking rate of the plurality of code patterns is different from a light-blocking rate of the light-blocking dummy patterns.

In an embodiment, the plurality of touch electrodes includes a plurality of driving electrodes, a plurality of sensing electrodes and a plurality of dummy electrodes. The plurality of driving electrodes, the plurality of sensing electrodes and the plurality of dummy electrodes are formed in a mesh structure between the plurality of emission areas.

In an embodiment, a width of the light-blocking dummy patterns is about equal to a width of the code patterns, and the thickness of the code patterns is greater than the thickness of the light-blocking dummy patterns, and a light-blocking rate of the code patterns is greater than that the light-blocking rate of the light-blocking dummy patterns.

In an embodiment, at least one side surface of each of the code patterns has a slope with a first inclination with respect to a plane, and a front surface of each of the code patterns has a slope with a second inclination with respect to the plane.

In an embodiment, the code patterns have a side slope with a first inclination, and a front slope with a second inclination. The code patterns refract and diffusely reflect infrared light incident from a front of the code patterns toward other sides of the code patterns.

In an embodiment, the plurality of code patterns and the light-blocking dummy patterns are formed as transparent or semi-transparent light-blocking members containing a transparent or semi-transparent pigment.

In an embodiment, the display unit further includes a plurality of color filter layers formed on the plurality of code patterns and the light-blocking dummy patterns, and covering the plurality of code patterns and the plurality of light-blocking dummy patterns.

According to embodiments of the present disclosure, a touch coordinate data of a touch input device on a display device in a touch input system can be generated and a touch input by the touch input device can be made without complicated calculation or correction by way of using code patterns of a display panel. As a result, according to embodiments, touch input features can be performed based on accurate input coordinates, manufacturing costs can be saved, power consumption can be reduced, and the driving process can become more efficient.

In addition, according to embodiments of the present disclosure, the recognition rate of the code patterns of a display device in a touch input system can be increased based on the configuration of the thickness and inclinations of the code patterns.

In addition, according to embodiments of the present disclosure, light-blocking dummy patterns are added on touch electrodes of a display panel, and as a result, the reflectance of the display panel can be reduced. Accordingly, the recognition rate and accuracy of code patterns and code information can be increased.

BRIEF DESCRIPTION OF THE DRAWINGS

The above and other aspects and features of the present disclosure will become more apparent by describing in detail embodiments thereof with reference to the accompanying drawings.

DETAILED DESCRIPTION OF THE EMBODIMENTS

Figure 1:
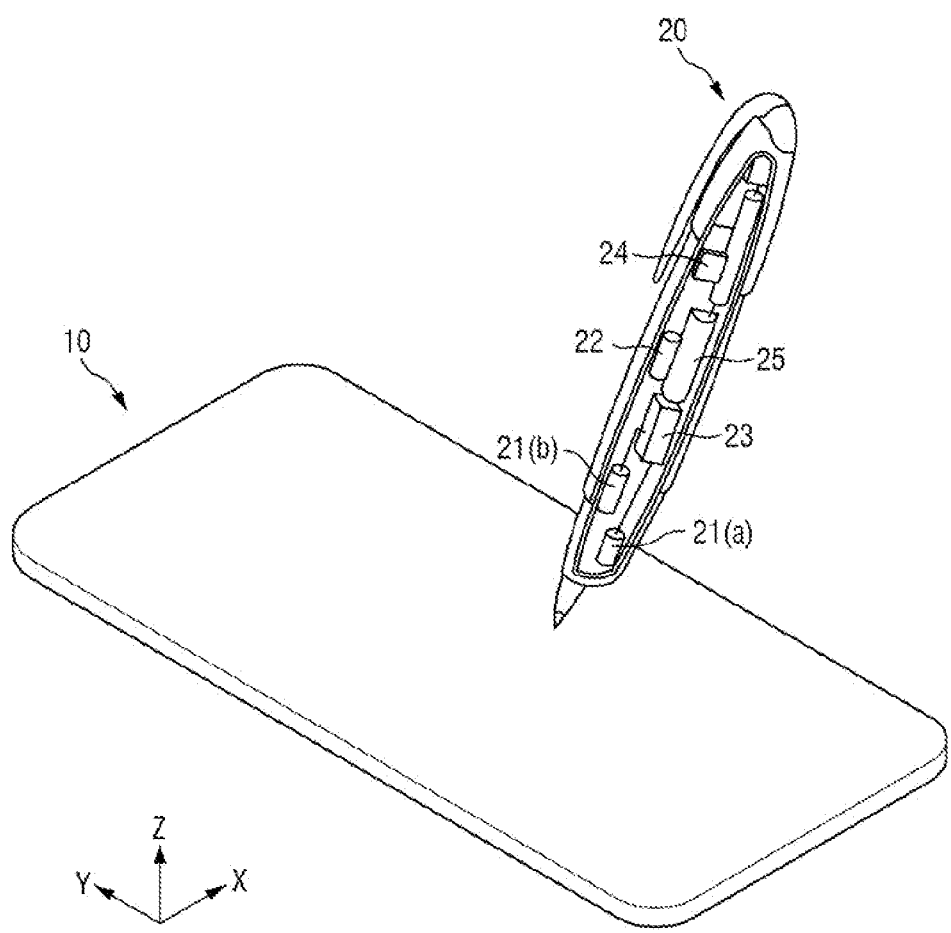
FIG. 1 is a view showing a configuration of a touch input system according to an embodiment of the present disclosure.

Embodiments of the present disclosure will be described more fully hereinafter with reference to the accompanying drawings. Like reference numerals may refer to like elements throughout the accompanying drawings.

It will be understood that when a component such as a film, a region, a layer, etc., is referred to as being "on", "connected to", "coupled to", or "adjacent to" another component, it can be directly on, connected, coupled, or adjacent to the other component, or intervening components may be present. It will also be understood that when a component is referred to as being "between" two components, it can be the only component between the two components, or one or more intervening components may also be present. It will also be understood that when a component is referred to as "covering" another component, it can be the only component covering the other component, or one or more intervening components may also be covering the other component. Other words used to describe the relationships between components should be interpreted in a like fashion.

It will be understood that, although the terms "first," "second," etc. may be used herein to describe various elements, these elements should not be limited by these terms. These terms are only used to distinguish one element from another element. For example, a first element discussed below could be termed a second element without departing from the teachings of the present disclosure. Similarly, the second element could also be termed the first element.

It should be understood that descriptions of features or aspects within each embodiment should typically be considered as available for other similar features or aspects in other embodiments, unless the context clearly indicates otherwise.

As used herein, the singular forms "a", "an" and "the" are intended to include the plural forms as well, unless the context clearly indicates otherwise.

Spatially relative terms, such as "beneath", "below", "lower", "under", "above", "upper", etc., may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below.

Herein, when two or more elements or values are described as being substantially the same as or about equal to each other, it is to be understood that the elements or values are identical to each other, the elements or values are equal to each other within a measurement error, or if measurably unequal, are close enough in value to be functionally equal to each other as would be understood by a person having ordinary skill in the art. For example, the term "about" as used herein is inclusive of the stated value and means within an acceptable range of deviation for the particular value as determined by one of ordinary skill in the art, considering the measurement in question and the error associated with measurement of the particular quantity (e.g., the limitations of the measurement system). For example, "about" may mean within one or more standard deviations as understood by one of the ordinary skill in the art. Further, it is to be understood that while parameters may be described herein as having "about" a certain value, according to embodiments, the parameter may be exactly the certain value or approximately the certain value within a measurement error as would be understood by a person having ordinary skill in the art. Other uses of these terms and similar terms to describe the relationships between components should be interpreted in a like fashion.

Figure 2:
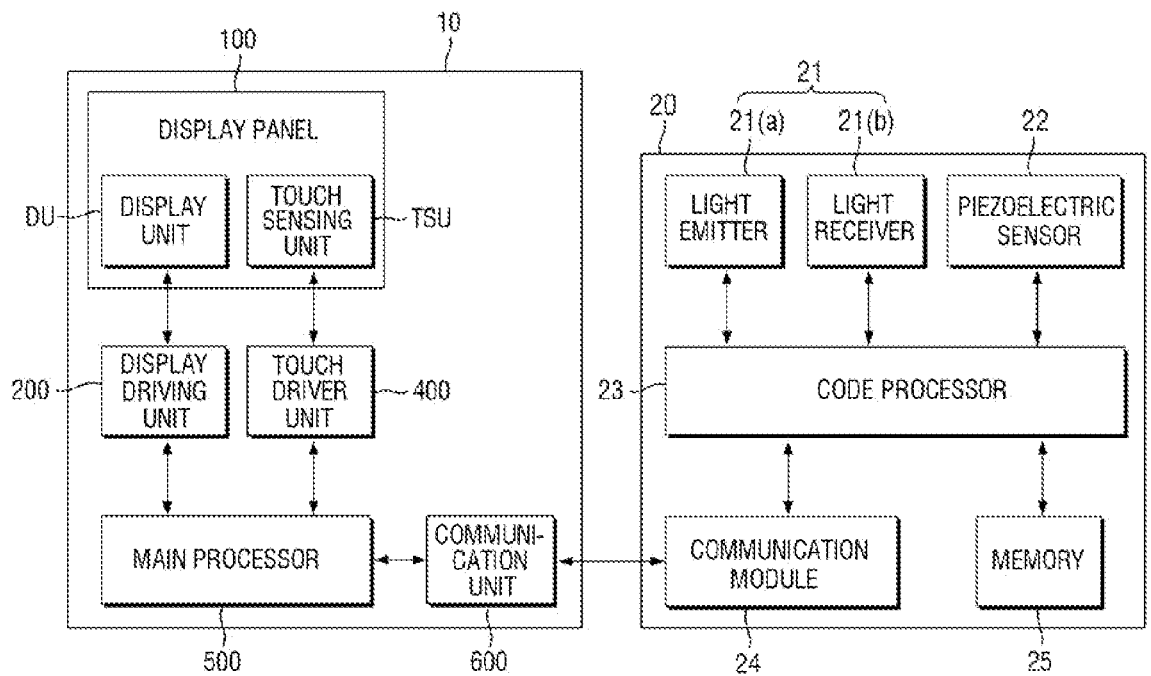
FIG. 2 is a block diagram of a touch input device and a display device shown in FIG. 1 according to an embodiment of the present disclosure.

FIG. 1 is a view showing a configuration of a touch input system according to an embodiment of the present disclosure. FIG. 2 is a block diagram of a touch input device and a display device shown in FIG. 1 according to an embodiment of the present disclosure.

Referring to FIGS. 1 and 2, a display device 10 may be employed by portable electronic devices such as, for example, a mobile phone, a smartphone, a tablet PC, a mobile communications terminal, an electronic notebook, an electronic book, a portable multimedia player (PMP), a navigation device and an ultra-mobile PC (UMPC). In an embodiment, the display device 10 may be used as a display unit of a television, a laptop computer, a monitor, an electronic billboard, or an Internet of Things (IOT) device. In an embodiment, the display device 10 may be applied to wearable devices such as a smartwatch, a watch phone, a glasses-type display, and a head-mounted display (HMD) device.

The display device 10 includes a display panel 100, a display driver 200, a touch driver 400, a main processor 500, and a communications unit 600. A touch input device 20 includes a code detector 21, a piezoelectric sensor 22, a code processor 23, a communications module 24, and a memory 25.

The display device 10 uses the touch input device 20 as a touch input tool. The display panel 100 of the display device 10 may include a display unit DU displaying images, and a touch sensing unit TSU sensing a touch input such as, for example, a part of a human body such as a finger and the touch input device 20.

The display unit DU of the display panel 100 may include a plurality of pixels and may display images through the plurality of pixels. The touch sensing unit TSU of the display panel 100 may be formed on the front side of the display panel 100. The touch sensing unit TSU may include a plurality of touch electrodes to sense a user's touch by capacitive sensing. Code patterns are formed on some of the plurality of touch electrodes, so that the code patterns are sensed by the touch input device 20.

The code patterns of the display panel 100 are formed of light-blocking members that form a predetermined plane code shape by covering some of the plurality of touch electrodes with a predetermined area. Accordingly, the code patterns are sensed by the touch input device according to the plane code shape of the light-blocking members and the size of the plane code. Light-blocking dummy patterns are formed on the front surfaces of some of the touch electrodes other than the touch electrodes on which the code patterns are formed.

For example, code patterns in the plane code shape are formed and disposed on a part of the front surfaces of some of the touch electrodes at a predetermined spacing. In addition, light-blocking dummy patterns that block infrared or ultraviolet light without being sensed by the touch input device 20 as code patterns are formed on the front surfaces of the touch electrodes on which the code patterns are not formed. The light-blocking dummy patterns may cover the front surfaces of the touch electrodes so that the front surfaces are not exposed, thereby reducing the reflective characteristics and reflectance of the touch electrodes. In this manner, it is possible to reduce the influence of reflected light by the touch electrodes to thereby increase the recognition rate and the accuracy of the code patterns of the touch input device 20. The structures of the code patterns and the light-blocking dummy patterns as well as the touch sensing unit TSU of the display panel 100 will be described in more detail below with reference to the accompanying drawings.

The display driver 200 may output signals and voltages for driving the display unit DU. The display driver 200 may supply data voltages to data lines. The display driver 200 may apply a supply voltage to a voltage line and may supply gate control signals to the gate driver.

The touch driver 400 may be connected to the touch sensing unit TSU. The touch driver 400 may supply a touch driving signal to a plurality of touch electrodes of the touch sensing unit TSU and may sense a change in the capacitance between the plurality of touch electrodes. The touch driver 400 may determine whether a user's touch is input and may find the coordinates of the touch based on the amount of the change in the capacitance between the touch electrodes.

The main processor 500 may control all of the functions of the display device 10. In an embodiment, the main processor 500 may apply digital video data to the display driver 200 so that the display panel 100 displays images. For example, the main processor 500 may receive touch data from the touch driver 400 to determine the coordinates of the user's touch, and then may generate digitizer video data based on the coordinates or may execute an application indicated by the icon displayed at the coordinates of the user's touch. In an embodiment, the main processor 500 may receive coordinate data from the touch input device 20 to determine the coordinates of the touch input device 20, and then may generate digitizer video data based on the coordinates or may execute an application indicated by the icon displayed at the touch coordinates of the touch input device 20.

The communications unit 600 may conduct wired/wireless communications with an external device. For example, the communications unit 600 may transmit/receive communication signals to/from the communications module 24 of the touch input device 20. The communications unit 600 may receive coordinate data composed of data codes from the touch input device 20 and may provide the coordinate data to the main processor 500.

The touch input device 20 may be used as a touch input tool and may be implemented as, for example, an electronic pen such as a smart pen. The touch input device 20 is an electronic pen that optically senses display light of the display panel 100 or light reflected off of the display panel 100. The touch input device 20 may detect code patterns included in the display panel 100 based on the sensed light and generate coordinate data. The touch input device 20 may be, but is not limited to, an electronic pen in the shape of a writing tool.

The code detector 21 of the touch input device 20 is disposed adjacent to the pen tip of the touch input device 20 to sense code patterns included in the display panel 100. To this end, the code detector 21 includes at least one light-outputting portion 21(a) (also referred to as a light-emitting portion) for outputting infrared light using at least one infrared light source, and at least one light-receiving portion 21(b) for detecting infrared light reflected off the code patterns with an infrared camera.

The at least one infrared light source included in the light-outputting portion 21(a) may be configured as an infrared LED array in a matrix pattern. The infrared camera of the light-receiving portion 21(b) may include a filter that transmits infrared rays and blocks wavelength ranges other than infrared rays, a lens system for focusing the infrared rays having transmitted the filter, and an optical image sensor that converts the optical image formed by the lens system into an electrical image signal and outputs it, etc. The optical image sensor is configured as an array in a matrix pattern like the infrared LED array, and may provide shape data of the code patterns to the code processor 23 according to the infrared shape reflected from the code patterns. In this manner, the code detector 21 of the touch input device 20 continuously detects code patterns included in some regions of the touch sensing unit TSU according to the user's control and motion, and may continuously generate the shape data of the code patterns to provide it to the code processor 23.

The code processor 23 may continuously receive shape data of code patterns from the code detector 21. For example, the code processor 23 may continuously receive shape data for the code patterns, and may identify the arrangement structure and shape of the code patterns. The code processor 23 may extract or generate data codes corresponding to the arrangement structure and shape of the code patterns, and may combine the data codes to extract or generate coordinate data corresponding to the combined data codes. The code processor 23 may transmit the generated coordinate data to the display device 10 through the communications module 24. For example, the code processor 23 receives the shape data of the code patterns and generates data codes corresponding to the code patterns to convert them, so that coordinate data can be quickly generated without complicated calculation or correction.

The communications module 24 may conduct wired/wireless communications with an external device. For example, the communications module 24 may transmit/receive communication signals to/from the communications unit 600 of the display device 10. The communications module 24 may receive coordinate data composed of data codes from the code processor 23 and may provide the coordinate data to the communications unit 600.

The memory 25 may store data necessary for driving the touch input device 20. The memory 25 stores shape data of the code patterns and data codes respectively corresponding to the shape data and the code patterns. In addition, the memory 25 stores data codes and coordinate data according to the combination of data codes. The memory 25 shares with the code processor 23 the data codes corresponding to respective shape data and code patterns, and coordinate data according to the combination of data codes. Accordingly, the code processor 23 may combine the data codes through the data codes and the coordinate data stored in the memory 25, and may extract or generate coordinate data corresponding to the combined data codes.

Figure 3:
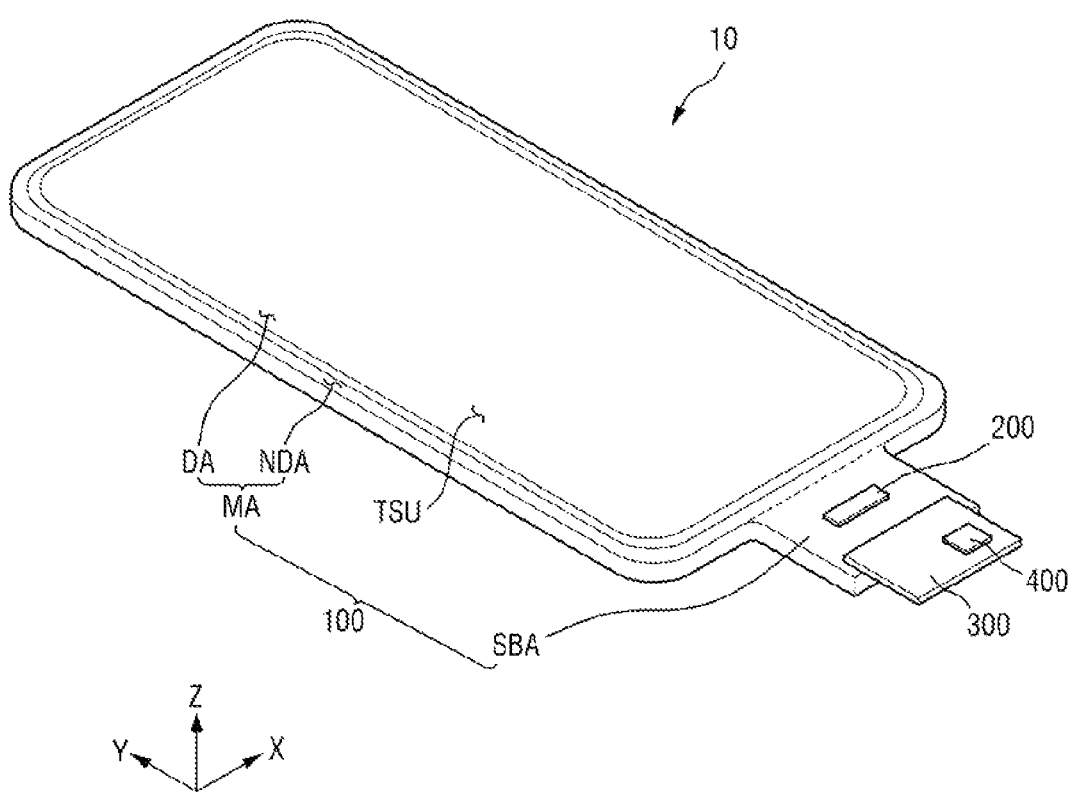
FIG. 3 is a perspective view showing the configuration of the display device shown in FIG. 2 according to an embodiment of the present disclosure.
Figure 4:
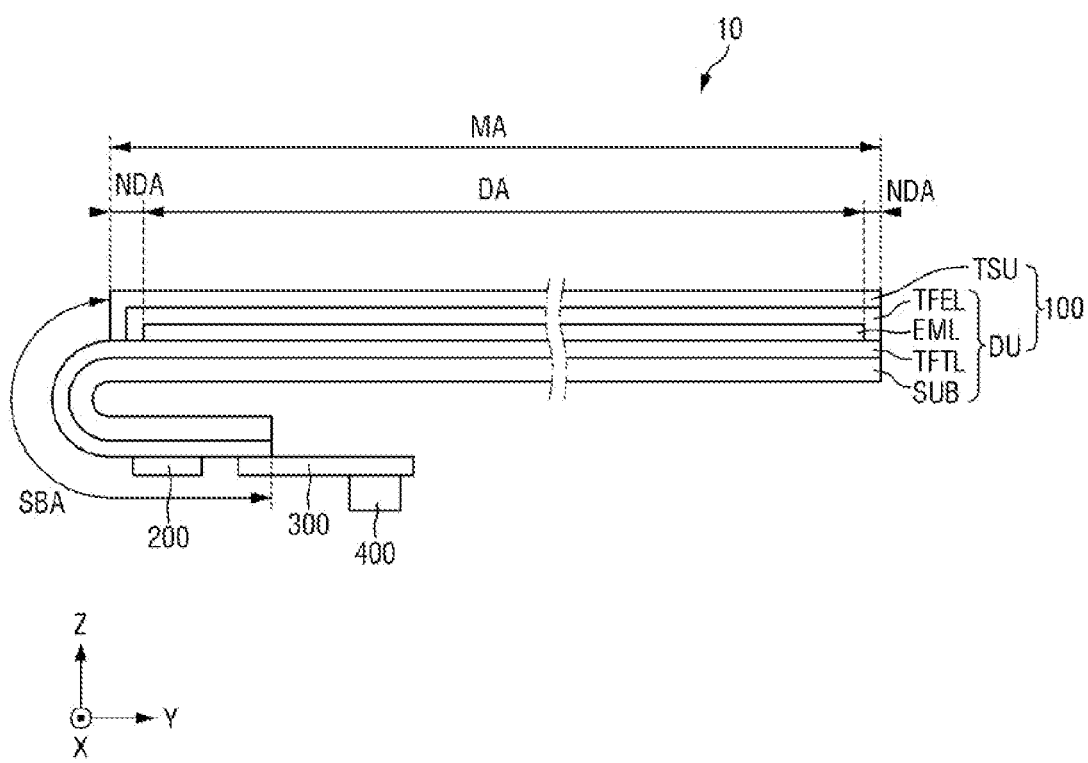
FIG. 4 is a cross-sectional view showing the configuration of the display device shown in FIG. 2 according to an embodiment of the present disclosure.

FIG. 3 is a perspective view showing the configuration of the display device shown in FIG. 2 according to an embodiment of the present disclosure. FIG. 4 is a cross-sectional view showing the configuration of the display device shown in FIG. 2 according to an embodiment of the present disclosure.

Referring to FIGS. 3 and 4, the display device 10 may have a shape similar to a quadrangle when viewed from the top (e.g., in a plan view). For example, the display device 10 may have a shape similar to a quadrangle having shorter sides in the x-axis direction and longer sides in the y-axis direction when viewed from the top. The corners where the shorter sides in the x-axis direction and the longer sides in the y-axis direction meet may be rounded to have a predetermined curvature or may be formed at a right angle. The shape of the display device 10 when viewed from the top is not limited to a quadrangular shape, but may be formed in a shape similar to, for example, other polygonal shapes, a circular shape, or an elliptical shape.

The display panel 100 may include a main area MA and a subsidiary area SBA.

The main area MA may include a display area DA having pixels for displaying images, and a non-display area NDA located around the display area DA. The display area DA may emit light from a plurality of emission areas or a plurality of opening areas. For example, the display panel 100 may include a pixel circuit including switching elements, a pixel-defining layer that defines the emission areas or the opening areas, and a self-light-emitting element.

The non-display area NDA may be disposed on the outer side of the display area DA. The non-display area NDA may be defined as the edge area of the main area MA of the display panel 100. The non-display area NDA may include a gate driver that applies gate signals to gate lines, and fan-out lines that connect the display driver 200 with the display area DA.

The subsidiary area SBA may extend from one side of the main area MA. The subsidiary area SUB may include a flexible material that can be bent, folded, or rolled. For example, when the subsidiary area SBA is bent, the subsidiary area SBA may overlap the main area MA in the thickness direction (z-axis direction). The subsidiary area SBA may include pads connected to the display driver 200 and the circuit board 300. In an embodiment, the subsidiary area SBA may be eliminated, and the display driver 200 and the pads may be disposed in the non-display area NDA.

The display driver 200 may be implemented as an integrated circuit (IC) and may be attached on the display panel 100 using, for example, a chip-on-glass (COG) technique, a chip-on-plastic (COP) technique, or ultrasonic bonding. In an embodiment, the display driver 200 may be disposed in the subsidiary area SBA and may overlap the main area MA in the thickness direction (z-axis direction) as the subsidiary area SBA is bent. In an embodiment, the display driver 200 may be mounted on the circuit board 300.

The circuit board 300 may be attached on the pads of the display panel 100 using an anisotropic conductive film (ACF). Lead lines of the circuit board 300 may be electrically connected to the pads of the display panel 100. The circuit board 300 may be, for example, a flexible printed circuit board (FPCB), a printed circuit board (PCB), or a flexible film such as a chip-on-film (COF).

The touch driver 400 may be mounted on the circuit board 300. The touch driver 400 may be implemented as an integrated circuit (IC). As described above, the touch driver 400 may supply a touch driving signal to a plurality of touch electrodes of the touch sensing unit TSU and may sense a change in the capacitance between the plurality of touch electrodes. The touch driving signal may be a pulse signal having a predetermined frequency. The touch driver 400 may determine whether there is touch by a part of a user's body such as, for example, a finger, and may find the coordinates of the touch, if any, based on the amount of the change in the capacitance between the touch electrodes.

Referring to FIG. 4, the display panel 100 may include a display unit DU, a touch sensing unit TSU, and a polarizing film. The display unit DU may include a substrate SUB, a thin-film transistor layer TFTL, an emission material layer EML and an encapsulation layer TFEL.

The substrate SUB may be a base substrate or a base member. The substrate SUB may be a flexible substrate that can be bent, folded, or rolled. In an embodiment, the substrate SUB may include, but is not limited to, a glass material or a metal material. In an embodiment, the substrate SUB may include a polymer resin such as polyimide PI.

The thin-film transistor layer TFTL may be disposed on the substrate SUB. The thin-film transistor layer TFTL may include a plurality of thin-film transistors forming pixel circuits of pixels. The thin-film transistor layer TFTL may include gate lines, data lines, voltage lines, gate control lines, fan-out lines for connecting the display driver 200 with the data lines, lead lines for connecting the display driver 200 with the pads, etc. When the gate driver is formed on one side of the non-display area NDA of the display panel 100, the gate driver may include thin-film transistors.

The thin-film transistor layer TFTL may be disposed in the display area DA, the non-display area NDA and the subsidiary area SBA. The thin-film transistors in each of the pixels, the gate lines, the data lines and the voltage lines in the thin-film transistor layer TFTL may be disposed in the display area DA. The gate control lines and the fan-out lines in the thin-film transistor layer TFTL may be disposed in the non-display area NDA. The lead lines of the thin-film transistor layer TFTL may be disposed in the subsidiary area SBA.

The emission material layer EML may be disposed on the thin-film transistor layer TFTL. The emission material layer EML may include a plurality of light-emitting elements in each of which a first electrode, an emissive layer and a second electrode are stacked on one another sequentially to emit light, and a pixel-defining layer for defining the pixels. The plurality of light-emitting elements in the emission material layer EML may be disposed in the display area DA. The emissive layer may be an organic emissive layer containing an organic material. The emissive layer may include, for example, a hole transporting layer, an organic light-emitting layer and an electron transporting layer. When the first electrode receives a voltage and the second electrode receives a cathode voltage through the thin-film transistors on the thin-film transistor layer TFTL, the holes and electrons may move to the organic light-emitting layer through the hole transporting layer and the electron transporting layer, respectively, such that they combine in the organic light-emitting layer to emit light. For example, the first electrode may be an anode electrode while the second electrode may be a cathode electrode. However, embodiments of the present disclosure are not limited thereto.

In an embodiment, the plurality of light-emitting elements may include quantum-dot light-emitting diodes including a quantum-dot emissive layer or inorganic light-emitting diodes including an inorganic semiconductor.

The encapsulation layer TFEL may cover the upper and side surfaces of the emission material layer EML, and can protect the emission material layer EML. The encapsulation layer TFEL may include at least one inorganic layer and at least one organic layer for encapsulating the emission material layer EML.

The touch sensing unit TSU may be disposed on the encapsulation layer TFEL. The touch sensing unit TSU may include a plurality of touch electrodes for sensing a user's touch by capacitive sensing, and touch lines connecting the plurality of touch electrodes with the touch driver 400. For example, the touch sensor unit TSU may sense a user's touch by self-capacitance sensing or mutual capacitance sensing.

In an embodiment, the touch sensing unit TSU may be disposed on a separate substrate disposed on the display unit DU. In such a case, the substrate supporting the touch sensing unit TSU may be a base member encapsulating the display unit DU.

The plurality of touch electrodes of the touch sensing unit TSU may be disposed in a touch sensor area overlapping the display area DA. The touch lines of the touch sensing unit TSU may be disposed in a touch peripheral area overlapping the non-display area NDA.

The subsidiary area SBA of the display panel 100 may extend from one side of the main area MA. The subsidiary area SUB may include a flexible material that can be bent, folded, or rolled. For example, when the subsidiary area SBA is bent, the subsidiary area SBA may overlap the main area MA in the thickness direction (z-axis direction). The subsidiary area SBA may include pads connected to the display driver 200 and the circuit board 300.

Figure 5:
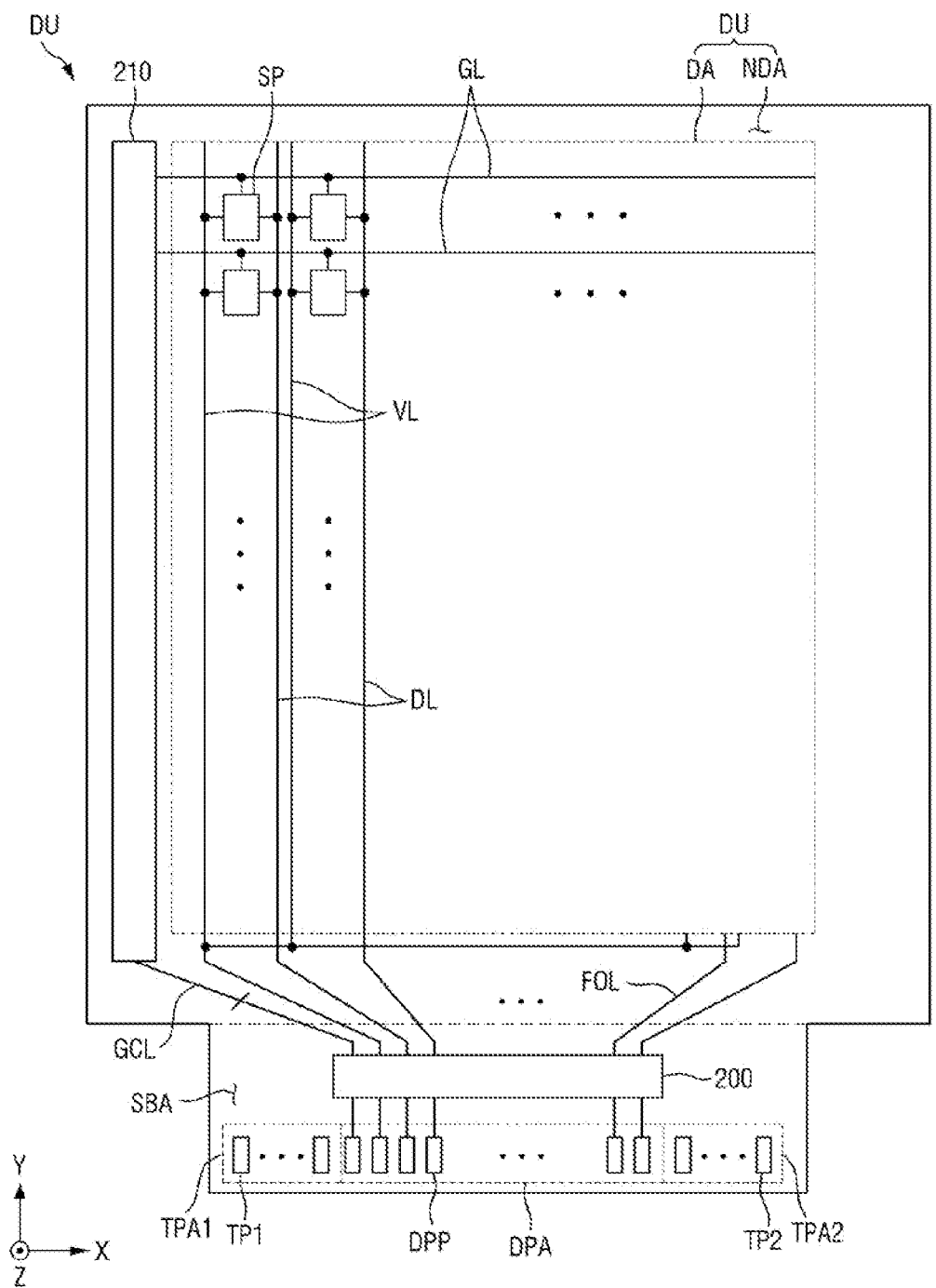
FIG. 5 is a plan view showing a display unit of a display device according to an embodiment of the present disclosure.

FIG. 5 is a plan view showing a display unit of a display device according to an embodiment of the present disclosure.

Referring to FIG. 5, the display area DA of the display unit DU may display images and may be defined as a central area of the display panel 100. The display area DA may include a plurality of pixels SP, a plurality of gate lines GL, a plurality of data lines DL and a plurality of voltage lines VL. Each of the plurality of pixels SP may be defined as the minimum unit that outputs light.

The plurality of gate lines GL may supply the gate signals received from the gate driver 210 to the plurality of pixels SP. The plurality of gate lines GL may extend in the x-axis direction and may be spaced apart from one another in the y-axis direction crossing the x-axis direction.

The plurality of data lines DL may supply the data voltages received from the display driver 200 to the plurality of pixels SP. The plurality of data lines DL may extend in the y-axis direction and may be spaced apart from one another in the x-axis direction.

The plurality of voltage lines VL may supply the supply voltage received from the display driver 200 to the plurality of pixels SP. The supply voltage may be at least one of a driving voltage, an initialization voltage, and a reference voltage. The plurality of voltage lines VL may extend in the y-axis direction and may be spaced apart from one another in the x-axis direction.

The non-display area NDA of the display unit DU may surround the display area DA. The non-display area NDA may include the gate driver 210, fan-out lines FOL, and gate control lines GCL. The gate driver 210 may generate a plurality of gate signals based on the gate control signal, and may sequentially supply the plurality of gate signals to the plurality of gate lines GL in a predetermined order.

The fan-out lines FOL may extend from the display driver 200 to the display area DA. The fan-out lines FOL may supply the data voltage received from the display driver 200 to the plurality of data lines DL.

A gate control line GCL may extend from the display driver 200 to the gate driver 210. The gate control line GCL may supply the gate control signal received from the display driver 200 to the gate driver 210.

The subsidiary area SBA may include the display driver 200, the display pad area DPA, and first and second touch pad areas TPA1 and TPA2.

The display driver 200 may output signals and voltages for driving the display panel 100 to the fan-out lines FOL. The display driver 200 may supply data voltages to the data lines DL through the fan-out lines FOL. The data voltages may be applied to the plurality of pixels SP, and the luminance of the plurality of pixels SP may be determined based on the data voltages. The display driver 200 may supply a gate control signal to the gate driver 210 through the gate control line GCL.

The display pad area DPA, the first touch pad area TPA1 and the second touch pad area TPA2 may be disposed on or near the edge of the subsidiary area SBA. The display pad area DPA, the first touch pad area TPA1 and the second touch pad area TPA2 may be electrically connected to the circuit board 300 using a low-resistance, high-reliability material such as, for example, an anisotropic conductive film and an SAP.

The display pad area DPA may include a plurality of display pads DPP. The plurality of display pads DPP may be connected to the main processor 500 through the circuit board 300. The plurality of display pads DPP may be connected to the circuit board 300 to receive digital video data and may supply digital video data to the display driver 200.

Figure 6:
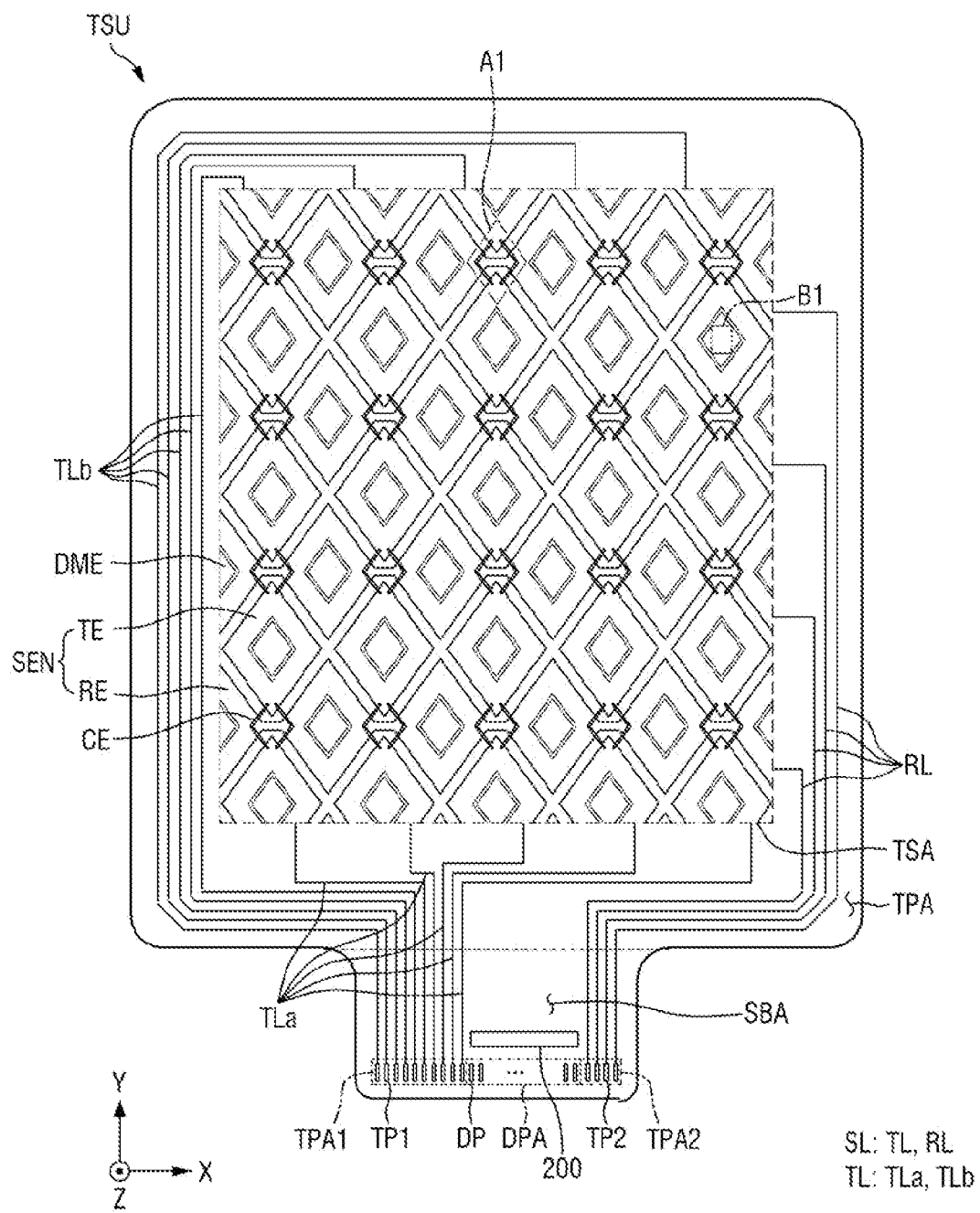
FIG. 6 is a plan view showing a touch sensing unit of a display device according to an embodiment of the present disclosure.

FIG. 6 is a plan view showing a touch sensing unit of a display device according to an embodiment of the present disclosure.

Referring to FIG. 6, the touch sensing unit TSU may include a touch sensor area TSA that senses a user's touch, and a touch peripheral area TPA disposed around the touch sensor area TSA. The touch sensor area TSA may overlap the display area DA of the display unit DU, and the touch peripheral area TPA may overlap the non-display area NDA of the display unit DU.

The touch sensor area TSA may include a plurality of touch electrodes SEN and a plurality of dummy electrodes DE. The plurality of touch electrodes SEN may form mutual capacitance or self-capacitance to sense a touch of an object or person. The plurality of touch electrodes SEN may include a plurality of driving electrodes TE and a plurality of sensing electrodes RE.

The plurality of driving electrodes TE may be arranged in the x-axis direction and the y-axis direction. The plurality of driving electrodes TE may be spaced apart from one another in the x-axis direction and the y-axis direction. The driving electrodes TE adjacent in the y-axis direction may be electrically connected through a plurality of connection electrodes CE.

The plurality of driving electrodes TE may be connected to first touch pads TP1 through driving lines TL. The driving lines TL may include lower driving lines TLa and upper driving lines TLb. For example, some of the driving electrodes TE disposed on the lower side of the touch sensor area TSA may be connected to the first touch pads TP1 through the lower driving lines TLa, and some others of the driving electrodes TE disposed on the upper side of the touch sensor area TSA may be connected to the first touch pads TP1 through the upper driving lines TLb. The lower driving lines TLa may extend to the first touch pads TP1 beyond the lower side of the touch peripheral area TPA. The upper driving lines TLb may extend to the first touch pads TP1 via the upper side, the left side and the lower side of the touch peripheral area TPA. The first touch pads TP1 may be connected to the touch driver 400 through the circuit board 300.

The connection electrodes CE may be bent at least once. Although the connection electrodes CE are illustrated as having the shape of an angle bracket "<" or ">", as shown in FIG. 6, the shape of the connection electrodes CE when viewed from the top (e.g., in a plan view) is not limited thereto. The driving electrodes TE adjacent to one another in the y-axis direction may be electrically connected by the plurality of connection electrodes CE. Even if one of the connection electrodes CE is disconnected, the driving electrodes TE can be stably connected through the remaining connection electrodes CE. The driving electrodes TE adjacent to each other may be connected by two connection electrodes CE. However, the number of connection electrodes CE is not limited thereto.

The connection electrodes CE may be disposed on a different layer from the plurality of driving electrodes TE and the plurality of sensing electrodes RE. The sensing electrodes RE adjacent to one another in the x-axis direction may be electrically connected to one another through connection portions disposed on the same layer as the plurality of driving electrodes TE or the plurality of sensing electrodes RE. For example, the plurality of sensing electrodes RE may extend in the x-axis direction and may be spaced apart from one another in the y-axis direction. The plurality of sensing electrodes RE may be arranged in the x-axis direction and the y-axis direction, and the sensing electrodes RE adjacent to one another in the x-axis direction may be electrically connected through the connection portions.

The driving electrodes TE adjacent to one another in the y-axis direction may be electrically connected through the connection electrodes CE disposed on a different layer from the plurality of driving electrodes TE or the plurality of sensing electrodes RE. The connection electrodes CE may be formed on the rear layer (or the lower layer) of the layer on which the driving electrodes TE and the sensing electrodes RE are formed. The connection electrodes CE are electrically connected to the driving electrode TE through a plurality of contact holes. Accordingly, even though the connection electrodes CE overlap the plurality of sensing electrodes RE in the z-axis direction, the plurality of driving electrodes TE and the plurality of sensing electrodes RE are insulated from each other. Mutual capacitance may be formed between the driving electrodes TE and the sensing electrodes RE.

The plurality of sensing electrodes RE may be connected to second touch pads TP2 through sensing lines RL. For example, some of the sensing electrodes RE disposed on the right side of the touch sensor area TSA may be connected to the second touch pads TP2 through the sensing lines RL. The sensing lines RL may extend to the second touch pads TP2 through the right side and the lower side of the touch peripheral area TPA. The second touch pads TP2 may be connected to the touch driver 400 through the circuit board 300.

Each of the plurality of dummy electrodes DE may be surrounded by the driving electrode TE or the sensing electrode RE. Each of the plurality of dummy electrodes DE may be spaced apart from and insulated from the driving electrode TE or the sensing electrode RE. Accordingly, the dummy electrodes DE may be electrically floating.

Code patterns in the plane code shape are formed at predetermined spacing on some regions of the front surface of at least one of the plurality of driving electrodes TE, the plurality of sensing electrodes RE, and the plurality of dummy electrodes DE. In addition, the light-blocking dummy patterns are formed on the front surfaces of the touch electrodes except the code patterns.

The display pad area DPA, the first touch pad area TPA1 and the second touch pad area TPA2 may be disposed on or near the edge of the subsidiary area SBA. The display pad area DPA, the first touch pad area TPA1 and the second touch pad area TPA2 may be electrically connected to the circuit board 300 using a low-resistance, high-reliability material such as, for example, an anisotropic conductive film and an SAP.

The first touch pad area TPA1 may be disposed on one side of the display pad area DPA and may include a plurality of first touch pads TP1. The plurality of first touch pads TP1 may be electrically connected to the touch driver 400 disposed on the circuit board 300. The plurality of first touch pads TP1 may supply touch driving signals to the plurality of driving electrodes TE through the plurality of driving lines TL.

The second touch pad area TPA2 may be disposed on the opposite side of the display pad area DPA and may include a plurality of second touch pads TP2. The plurality of second touch pads TP2 may be electrically connected to the touch driver 400 disposed on the circuit board 300. The touch driver 400 may receive a touch sensing signal through the plurality of sensing lines RL connected to the plurality of second touch pads TP2, and may sense a change in the capacitance between the driving electrodes TE and the sensing electrodes RE.

In an embodiment, the touch driver 400 may supply a touch driving signal to each of the plurality of driving electrodes TE and the plurality of sensing electrodes RE, and may receive a touch sensing signal from each of the plurality of driving electrodes TE and the plurality of sensing electrodes RE. The touch driver 400 may sense a change in the amount of charges in each of the plurality of driving electrodes TE and the plurality of sensing electrodes RE based on the touch sensing signal.

Figure 7:
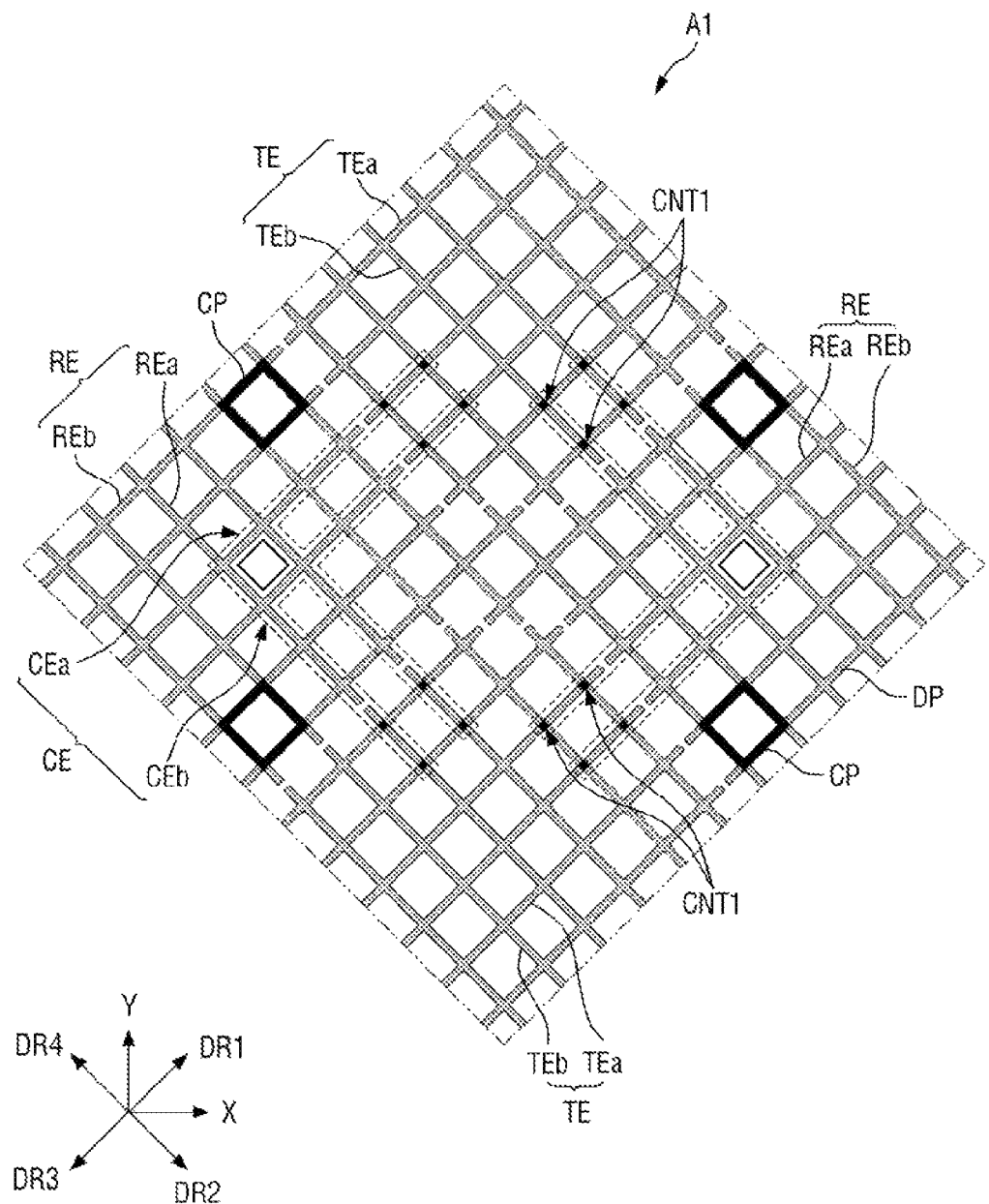
FIG. 7 is an enlarged view showing the code patterns and the light-blocking patterns formed in area μl of FIG. 6 according to an embodiment of the present disclosure.
Figure 8:
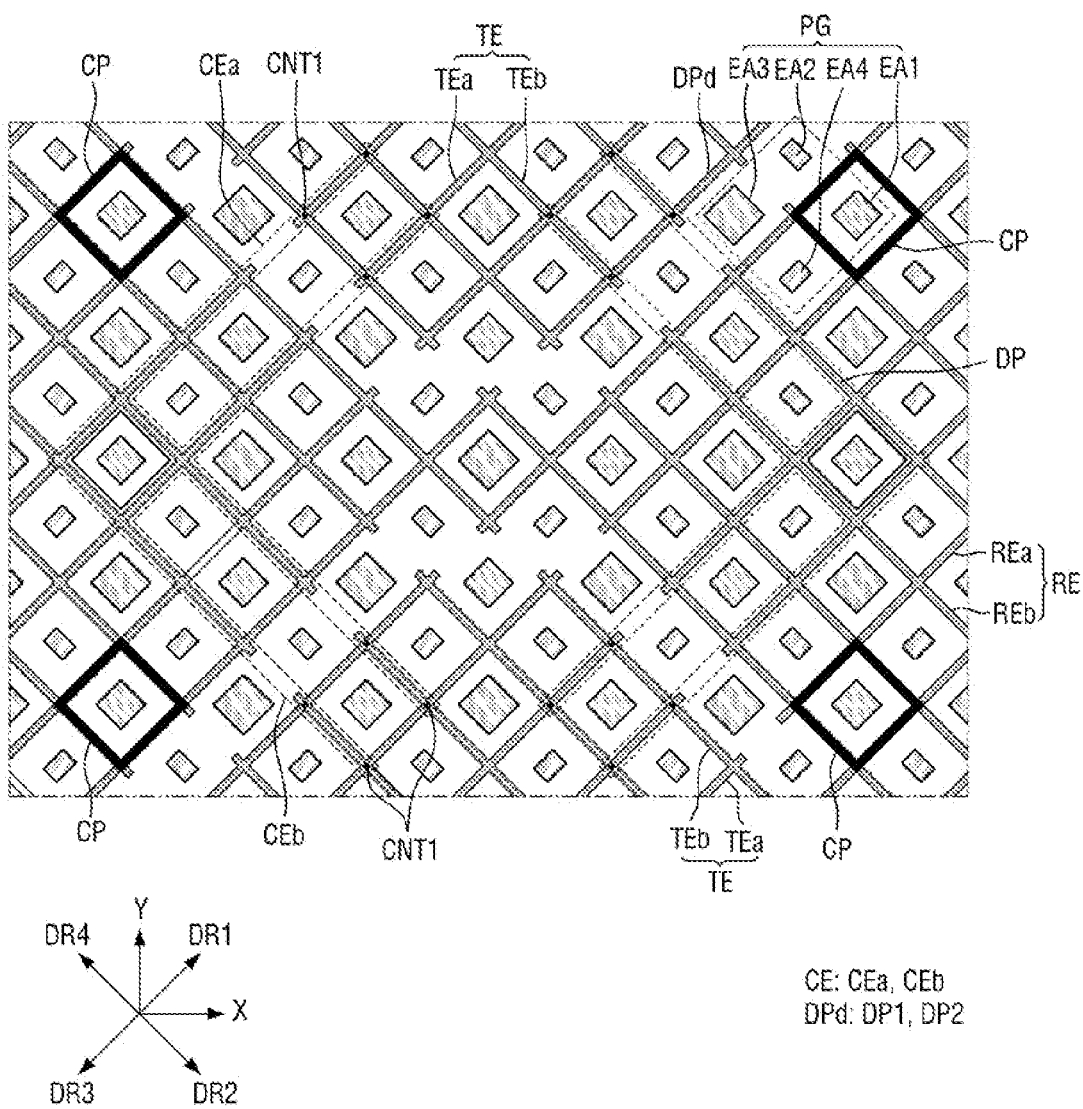
FIG. 8 is an enlarged view showing area μl in which the code patterns and the light-blocking patterns are disposed according to an embodiment of the present disclosure.

FIG. 7 is an enlarged view showing the code patterns and the light-blocking patterns formed in area μl of FIG. 6 according to an embodiment of the present disclosure. FIG. 8 is an enlarged view showing area μl in which the code patterns and the light-blocking patterns are disposed according to an embodiment of the present disclosure.

Referring to FIGS. 7 and 8, a plurality of driving electrodes TE, a plurality of sensing electrodes RE and a plurality of dummy electrodes DE may be disposed on the same layer and may be spaced apart from one another.

The plurality of driving electrodes TE may be arranged in the x-axis direction and the y-axis direction. The plurality of driving electrodes TE may be spaced apart from one another in the x-axis direction and the y-axis direction. The driving electrodes TE adjacent in the y-axis direction may be electrically connected through a plurality of connection electrodes CE.

The plurality of sensing electrodes RE may extend in the x-axis direction and may be spaced apart from one another in the y-axis direction. The plurality of sensing electrodes RE may be arranged in the x-axis direction and the y-axis direction, and the sensing electrodes RE adjacent to one another in the x-axis direction may be electrically connected.

For example, the sensing electrodes RE may be electrically connected through connection portions, and the connection portions may be disposed within the shortest distance between the driving electrodes TE adjacent to each other.

The connection electrodes CE may be disposed on a different layer from the plurality of driving electrodes TE and the plurality of sensing electrodes RE, e.g., a rear surface layer. Each of the connection electrodes CE may include a first portion CEa and a second portion CEb. For example, the first portion CEa of the connection electrode CE may be connected to the driving electrode TE disposed on one side through a first contact hole CNT1 and may extend in the third direction DR3. The second portion CEb of the connection electrode CE may be bent from the first portion CEa where it overlaps the sensing electrode RE to be extended in the second direction DR2, and may be connected to the driving electrode TE disposed on the other side through the first contact hole CNT1. In the following description, the first direction DR1 may be a direction between the x-axis direction and the y-axis direction, the second direction DR2 may be a direction between the direction opposite to the y-axis direction and the x-axis direction, the third direction DR3 may be the direction opposite to the first direction DR1, and a fourth direction DR4 may be the direction opposite to the second direction DR2. Accordingly, each of the plurality of connection electrodes CE may connect the adjacent driving electrodes TE in the y-axis direction.

Each of the pixels groups PG may include first to third sub-pixels or first to fourth sub-pixels. The first to fourth sub-pixels may include first to fourth emission areas EA1, EA2, EA3, and EA4, respectively. For example, the first emission area EA1 may emit light of a first color or red light, the second emission area EA2 may emit light of a second color or green light, and the third emission area EA3 may emit light of a third color or blue light. In addition, the fourth emission area EA4 may emit light of the fourth color or light of one of the first to third colors. However, embodiments of the present disclosure are not limited thereto.

One pixel group PG may represent a black-and-white or grayscale image through the first to third emission areas EA1 to EA3 or the first to fourth emission areas EA1 to EA4. Grayscales of various colors, such as white, may be represented by combinations of light emitted from the first to third emission areas EA1 to EA3 or the first to fourth emission areas EA1 to EA4.

According to the arrangement structure of the first to third sub-pixels or the first to fourth sub-pixels, the plurality of driving electrodes TE, the plurality of sensing electrodes RE and the plurality of dummy electrodes DE are formed in a mesh structure or a net structure when viewed from the top (e.g., when viewed in a plan view).

The plurality of driving electrodes TE, the plurality of sensing electrodes RE and the plurality of dummy electrodes DE may be disposed between and surround the first to third emission areas EA1 to EA3 or the first to fourth emission areas EA1 to EA4, forming a pixel group PG when viewed from the top (e.g., when viewed in a plan view). Accordingly, in embodiments of the present disclosure, the plurality of driving electrodes TE, the plurality of sensing electrodes RE and the plurality of dummy electrodes DE do not overlap the first to fourth emission areas EA1 to EA4. In embodiments of the present disclosure, the plurality of connection electrodes CE do not overlap the first to fourth emission areas EA1 to EA4. Accordingly, the display device 10 can prevent the luminance of the light exiting from the first to fourth emission areas EA1, EA2, EA3 and EA4 from being lowered by the touch sensing unit TSU.

Each of the plurality of driving electrodes TE may include a first portion TEa extended in the first direction DR1 and a second portion TEb extended in the second direction DR2, so that in embodiments of the present disclosure, the plurality of driving electrodes TE do not overlap the first to fourth emission areas EA1 to EA4. Each of the plurality of sensing electrodes RE may include a first portion REa extended in the first direction DR1 and a second portion REb extended in the second direction DR2, so that in embodiments of the present disclosure, the plurality of sensing electrodes RE do not overlap the first to fourth emission areas EA1 to EA4. In embodiments of the present disclosure, the plurality of dummy electrodes DE do not overlap the first to fourth emission areas EA1 to EA4. Thus, in embodiments of the present disclosure, each of the touch electrodes TE and RE includes at least one portion (e.g., Tea, TEb of TE, and Rea, Reb of RE) disposed between adjacent emission areas among the plurality of emission areas EA1, EA2, EA3 and EA4.

Code patterns CP and light-blocking dummy patterns DP are formed on the front surfaces of a plurality of dummy electrodes DE, a plurality of driving electrodes TE, and a plurality of sensing electrodes RE. The code patterns CP and the light-blocking dummy pattern DP are formed via the same process.

The code patterns CP are formed at predetermined spacing (e.g., about 300 μm) in some regions of the front surfaces of the plurality of dummy electrodes DE, the plurality of driving electrodes TE, and the plurality of sensing electrodes RE. When the code patterns CP are formed, the light-blocking dummy patterns DP are formed on the regions of the front surfaces of the plurality of dummy electrodes DE, the plurality of driving electrodes TE, and the plurality of sensing electrodes RE other than the regions where the code patterns CP are formed.

Each of the code patterns CP is formed by covering some regions of the front surface of at least one of the plurality of driving electrodes TE, the plurality of sensing electrodes RE and the plurality of dummy electrodes DE with the plane cord shape of a predetermined size. They may be formed by covering not only some regions of the front surface of each of the electrodes, but also by covering at least one side surface along with the front surface.

The code patterns CP may reduce the reflectance of infrared light by blocking and reflecting the infrared light applied from the touch input device 20. The code patterns may be recognized by the touch input device 20 according to the code shape with reduced reflectance of infrared light. To this end, the code patterns CP may be formed to have a height or a thickness larger than the height or thickness of the light-blocking dummy patterns DP, and inclined surfaces of a predetermined inclination may be formed on the side and front surfaces of the code patterns CP. Herein, the terms "height" and "thickness" may be used interchangeably, and may refer to the thickness of the described component in the thickness direction (z-axis direction) of the device.

The plane code shape of each of the code patterns CP may be formed in a closed loop shape such as, for example, a rectangle, a square, a circle and a diamond. Alternatively, the flat code shape of each of the code patterns CP may be formed in an open loop shape that surrounds only a part of one emission area. In addition, the plane code shape of each of the code patterns CP may be formed in a straight line shape or curved line shape having a predetermined length. When the code patterns CP are disposed between and surround the plurality of emission areas instead of one emission area, the shape of the code patterns CP may be formed in a mesh structure and a net structure when viewed from the top (e.g., when viewed in a plan view). Hereinafter, an example where the code patterns CP are formed in a diamond shape forming a closed loop when viewed from the top will be described.

The light-blocking dummy patterns DP may be formed together with the code patterns CP when the code patterns CP are formed, and may be formed in regions other than the regions where the code patterns CP are formed. For example, the light-blocking dummy patterns DP may be disposed and formed so that they cover the entire front surfaces of the plurality of dummy electrodes DE, the plurality of driving electrodes TE and the plurality of sensing electrodes RE on which the code patterns CP are not formed. Since the light-blocking dummy patterns DP and the code patterns CP are formed via the same process, the light-blocking dummy patterns DP and the code patterns CP may be formed of the same material.

The code patterns CP and the light-blocking dummy patterns DP are formed of light-blocking members made of a material that absorbs light. The code patterns CP and the light-blocking dummy pattern DP may be formed via a patterning process using a half tone mask. The light-blocking dummy patterns DP are formed within a predetermined thickness or height so that they can block light and are not recognized as code patterns. For example, the light-blocking dummy patterns DP are formed within a predetermined thickness so that they can reduce the reflectance of the plurality of driving electrodes TE, the plurality of sensing electrodes RE and the plurality of dummy electrodes DE, and are not recognized as code patterns by the touch input device 20. The thickness or height of the light-blocking dummy patterns DP may be predetermined and formed differently depending on the use environments such as the outside brightness of the display device 10, the intensity and the wavelength band of infrared light of the touch input device 20. Alternatively, each of the code patterns CP may be higher or thicker than the thickness of the light-blocking dummy patterns DP by a predetermined height or thickness or more, and may have a greater light-blocking rate than the light-blocking dummy patterns DP so that the code patterns CP may be recognized as the code patterns by the touch input device 20.

The light-blocking dummy patterns DP may be formed in a substantially straight line or curved line shape having a predetermined length, or may be formed in an open loop shape that is bent to surround a part of at least one emission area. Alternatively, the light-blocking dummy patterns DP may be formed so that they cover the entire front surfaces of the plurality of dummy electrodes DE, the plurality of driving electrodes TE and the plurality of sensing electrodes RE to increase the overall light-blocking effect. In such a case, the overall shape of the light-blocking dummy patterns DP may be formed in a mesh structure and a net structure when viewed from the top.

The light-blocking dummy patterns DP that block infrared and ultraviolet lights without being recognized as a code shape are formed on the front surfaces of the touch electrodes SEN and the dummy electrodes DE on which the code patterns CP are not formed, so that the exposed areas of the touch electrodes SEN and the dummy electrodes DE can be reduced. Accordingly, by reducing the reflective characteristics and reflectance of the touch electrodes SEN and the dummy electrodes DE, the recognition rate and accuracy of the code patterns CP of the touch input device 20 can be increased.

Figure 9:
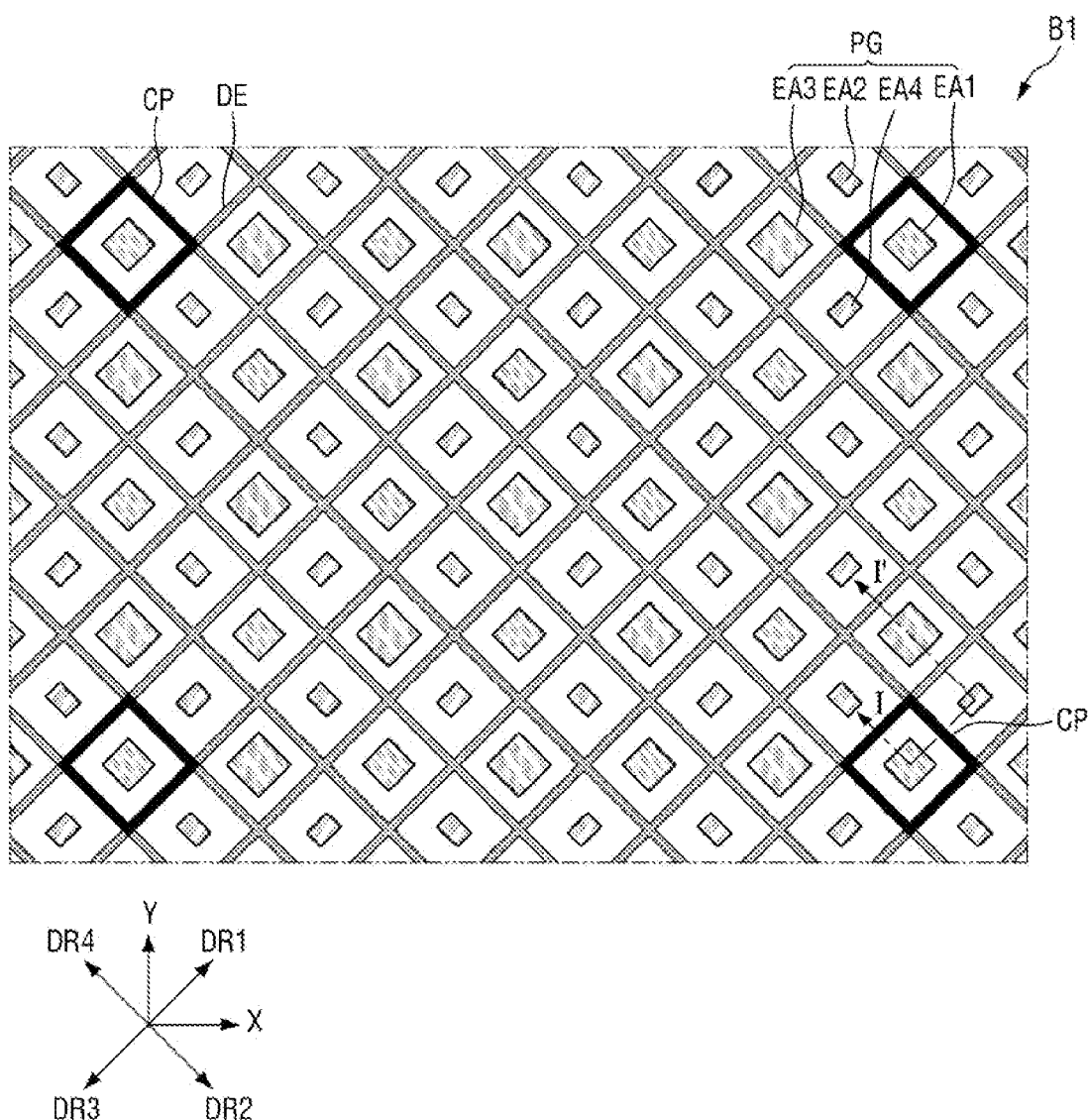
FIG. 9 is an enlarged view showing the code patterns and the light-blocking patterns formed in area B1 shown in FIG. 6 in further detail according to an embodiment of the present disclosure.

FIG. 9 is an enlarged view showing the code patterns and the light-blocking patterns formed in area B1 shown in FIG. 6 in further detail according to an embodiment of the present disclosure.

Referring to FIG. 9, code patterns CP may be formed at predetermined spacing of about 300 µm on the front surfaces of the driving electrodes TE and the sensing electrodes RE, as well as the dummy electrodes DE. In addition, the light-blocking dummy patterns DP are formed on a part of the front surfaces or on the entire front surfaces of the electrodes DE, TE and RE where the code patterns CP are not formed.

The width in at least one direction, the size and the length in at least one direction of the code patterns CP may be set and formed so that they correspond to the size, sensing area, arrangement, etc. of the light-receiving portion 21(b) or the optical image sensor included in the code detector 21 of the touch input device 20. The code patterns CP have a thickness greater than the thickness of the nearby light-blocking dummy patterns DP by a predetermined thickness or more, so that the code patterns CP are darker and have a higher light-blocking rate than the nearby light-blocking dummy patterns DP. Accordingly, the code detector 21 of the touch input device 20 may recognize the width, size and length of the code patterns CP with a clearer contrast than the nearby light-blocking dummy patterns DP to sense the code shape of the code patterns CP.

The light-blocking dummy patterns DP may be formed in a mesh structure of a predetermined size according to the shape of the electrodes DE, TE and RE in regions other than the regions where the code patterns CP are formed. For example, the light-blocking dummy patterns DP are formed to be disposed between and surround the border of the entire emission areas EA1 to EA4, so that the overall shape may be formed in a mesh structure when viewed from the top (e.g., when viewed in a plan view).

The overall width and length of the light-blocking dummy patterns DP in the mesh structure are greater or longer than the width and length of the code patterns CP, and the amount of reflected infrared light and the intensity of the reflected infrared light are greater than those of the code patterns CP. Therefore, in embodiments of the present disclosure, the light-blocking dummy patterns DP are not recognized as a code shape by the code detector 21.

Figure 10:
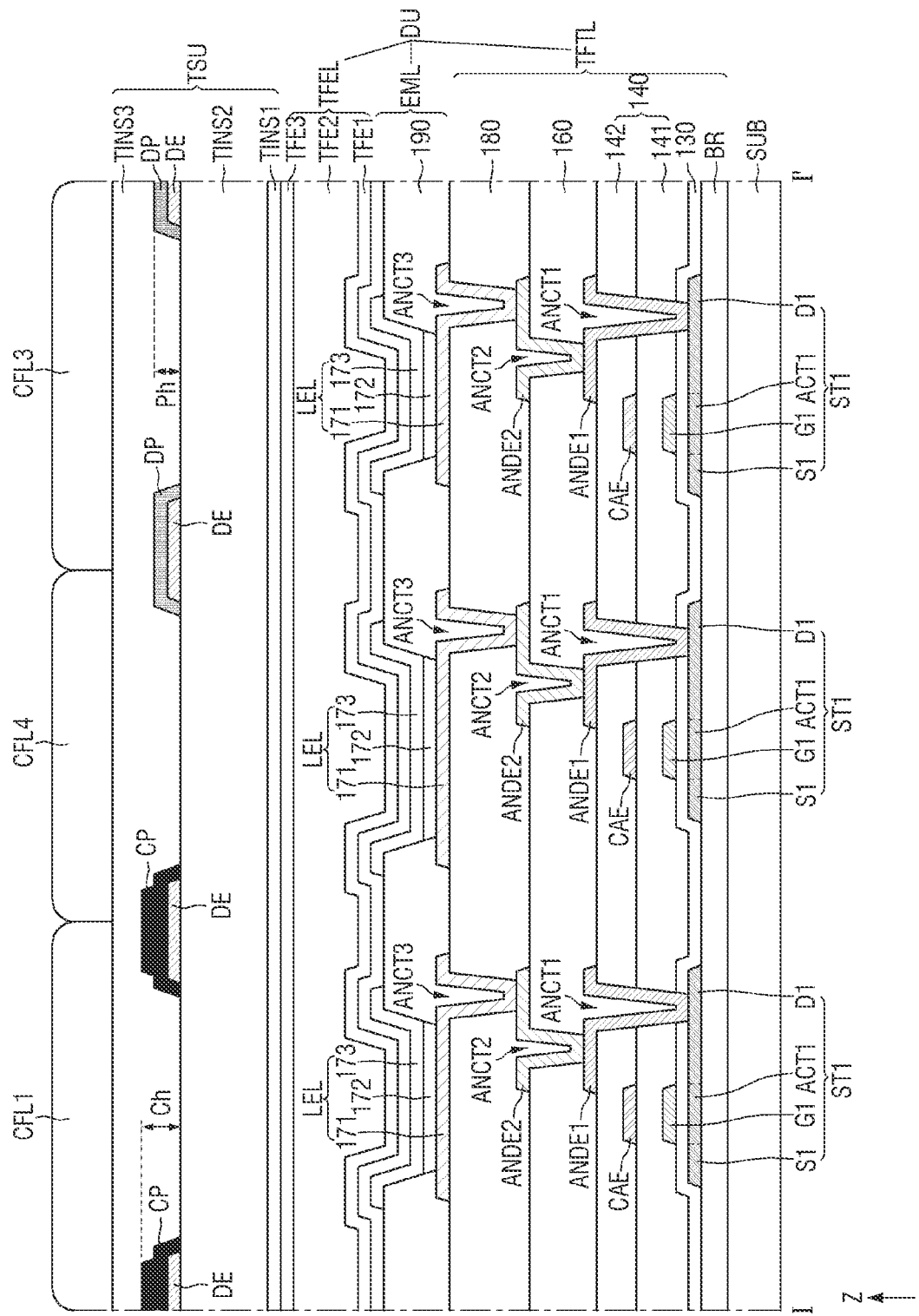
FIG. 10 is a cross-sectional view showing the cross-sectional structure, taken along line I-I' of FIG. 9 according to an embodiment of the present disclosure.
Figure 11:
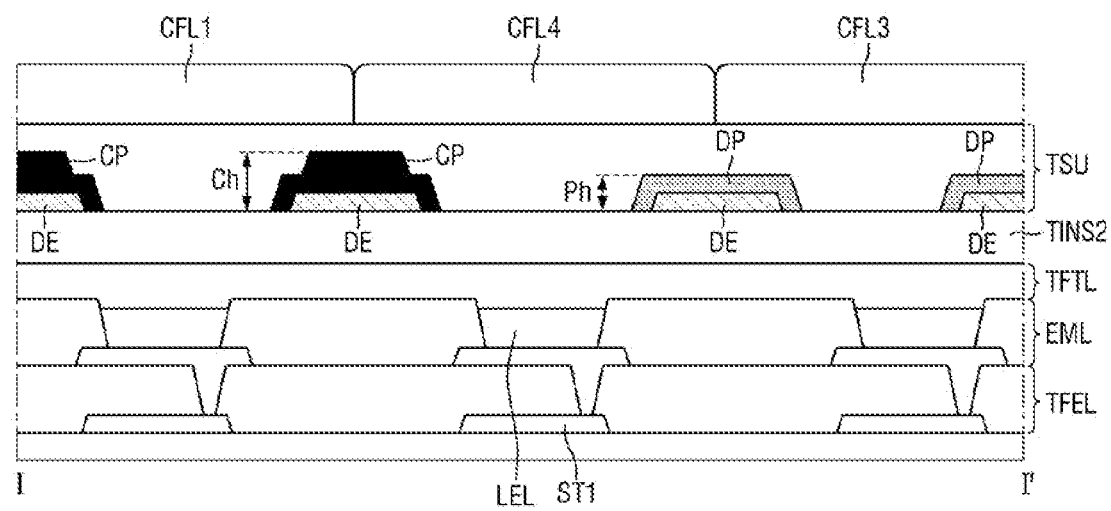
FIG. 11 is a cross-sectional view showing the cross-sectional structure taken along line I-I of FIG. 10 as simple blocks.

FIG. 10 is a cross-sectional view showing the cross-sectional structure taken along line I-I' of FIG. 9 according to an embodiment of the present disclosure. FIG. 11 is a cross-sectional view showing the cross-sectional structure taken along line I-I of FIG. 10 as simple blocks according to an embodiment of the present disclosure.

Referring to FIGS. 10 and 11, a barrier layer BR may be disposed on the substrate SUB. The substrate SUB may include an insulating material such as a polymer resin. For example, the substrate SUB may include polyimide. The substrate SUB may be a flexible substrate that can be bent, folded, or rolled.

The barrier layer BR is a layer that protects the thin-film transistors of the thin-film transistor layer TFTL and an emissive layer 172 of the emission material layer EML. The barrier layer BR may be formed of multiple inorganic layers stacked alternately on one another. For example, the barrier layer BR may include multiple layers in which one or more inorganic layers of, for example, a silicon nitride layer, a silicon oxynitride layer, a silicon oxide layer, a titanium oxide layer and an aluminum oxide layer are alternately stacked on one another.

Thin-film transistors ST1 may be disposed on the barrier layer BR. Each of the thin-film transistors ST1 includes an active layer ACT1, a gate electrode G1, a source electrode S1, and a drain electrode D1.

The active layer ACT1, the source electrode S1 and the drain electrode D1 of each of the thin-film transistors ST1 may be disposed on the barrier layer BR. The active layer ACT1 of each of the thin-film transistors ST1 includes, for example, polycrystalline silicon, single crystalline silicon, low-temperature polycrystalline silicon, amorphous silicon, or an oxide semiconductor. A part of the active layer ACT1 overlapping the gate electrode G1 in the third direction (z-axis direction), that is, the thickness direction of the substrate SUB, may be defined as a channel region. The source electrode S1 and the drain electrode D1 are regions that do not overlap the gate electrode G1 in the third direction (z-axis direction), and may have conductivity by doping ions or impurities into a silicon semiconductor or an oxide semiconductor.

A gate insulator 130 may be disposed on the active layer ACT1, the source electrode S1 and the drain electrode D1 of each of the thin-film transistors ST1. The gate insulator 130 may be formed of an inorganic layer such as, for example, a silicon nitride layer, a silicon oxynitride layer, a silicon oxide layer, a titanium oxide layer, or an aluminum oxide layer.

The gate electrode G1 of each of the thin-film transistors ST1 may be disposed on the gate insulator 130. The gate electrode G1 may overlap the active layer ACT1 in the third direction (z-axis direction). The gate electrode G1 may include a single layer or multiple layers of one of, for example, molybdenum (Mo), aluminum (Al), chromium (Cr), gold (Au), titanium (Ti), nickel (Ni), neodymium (Nd) and copper (Cu) or an alloy thereof.

A first interlayer dielectric layer 141 may be disposed on the gate electrode G1 of each of the thin-film transistors ST1. The first interlayer dielectric layer 141 may be formed of an inorganic layer such as, for example, a silicon nitride layer, a silicon oxynitride layer, a silicon oxide layer, a titanium oxide layer, or an aluminum oxide layer. The first interlayer dielectric layer 141 may include a plurality of inorganic layers.

A capacitor electrode CAE may be disposed on the first interlayer dielectric layer 141. The capacitor electrode CAE may overlap the gate electrode G1 of the first thin-film transistor ST1 in the third direction (z-axis direction). Since the first interlayer dielectric layer 141 has a predetermined dielectric constant, a capacitor can be formed by the capacitor electrode CAE, the gate electrode G1, and the first interlayer dielectric layer 141 disposed therebetween. The capacitor electrode CAE may include a single layer or multiple layers of one of, for example, molybdenum (Mo), aluminum (Al), chromium (Cr), gold (Au), titanium (Ti), nickel (Ni), neodymium (Nd) and copper (Cu) or an alloy thereof.

A second interlayer dielectric layer 142 may be disposed over the capacitor electrode CAE. The second interlayer dielectric layer 142 may be formed of an inorganic layer such as, for example, a silicon nitride layer, a silicon oxynitride layer, a silicon oxide layer, a titanium oxide layer, or an aluminum oxide layer. The second interlayer dielectric layer 142 may include a plurality of inorganic layers.

A first anode connection electrode ANDE1 may be disposed on the second interlayer dielectric layer 142. The first anode connection electrode ANDE1 may be connected to the drain electrode D1 of the thin-film transistor ST1 through a first connection contact hole ANCT1 that penetrates the gate insulator 130, the first interlayer dielectric layer 141 and the second interlayer dielectric layer 142. The first anode connection electrode ANDE1 may include a single layer or multiple layers of one of, for example, molybdenum (Mo), aluminum (Al), chromium (Cr), gold (Au), titanium (Ti), nickel (Ni), neodymium (Nd) and copper (Cu) or an alloy thereof.

A first planarization layer 160 may be disposed over the first anode connection electrode ANDE1 and may provide a flat surface over level differences due to the thin-film transistor ST1. The first planarization layer 160 may be formed of an organic layer such as, for example, an acryl resin, an epoxy resin, a phenolic resin, a polyamide resin and a polyimide resin.

A second anode connection electrode ANDE2 may be disposed on the first planarization layer 160. The second anode connection electrode ANDE2 may be connected to the first anode connection electrode ANDE1 through a second connection contact hole ANCT2 penetrating the first planarization layer 160. The second anode connection electrode ANDE2 may include a single layer or multiple layers of one of, for example, molybdenum (Mo), aluminum (Al), chromium (Cr), gold (Au), titanium (Ti), nickel (Ni), neodymium (Nd) and copper (Cu) or an alloy thereof.

A second planarization layer 180 may be disposed on the second anode connection electrode ANDE2. The second planarization layer 180 may be formed as an organic layer such as, for example, an acryl resin, an epoxy resin, a phenolic resin, a polyamide resin and a polyimide resin.

Light-emitting elements LEL and a bank 190 may be disposed on the second planarization layer 180. Each of the light-emitting elements LEL includes a pixel electrode 171, an emissive layer 172, and a common electrode 173.

The pixel electrode 171 may be disposed on the second planarization layer 180. The pixel electrode 171 may be connected to the second anode connection electrode ANDE2 through a third connection contact hole ANCT3 penetrating the second planarization layer 180.

In the top-emission structure in which light exits from the emissive layer 172 toward the common electrode 173, the pixel electrode 171 may include a metal material having a high reflectivity such as, for example, a stack structure of aluminum and titanium (Ti/Al/Ti), a stack structure of aluminum and indium tin oxide (ITO) (ITO/Al/ITO), an APC alloy and a stack structure of APC alloy and ITO (ITO/APC/ITO). The APC alloy is an alloy of silver (Ag), palladium (Pd) and copper (Cu).

The bank 190 may partition the pixel electrode 171 on the second planarization layer 180 to define the first to third emission areas EA1 to EA3. The bank 190 may cover the edges of the pixel electrodes 171. The bank 190 may be formed of an organic layer such as, for example, an acryl resin, an epoxy resin, a phenolic resin, a polyamide resin and a polyimide resin.

In each of the first to third emission areas EA1, EA2 and EA3, the pixel electrode 171, the emissive layer 172 and the common electrode 173 are stacked sequentially on one another, so that holes from the pixel electrode 171 and electrons from the common electrode 173 are combined with each other in the emissive layer 172 to emit light.

The emissive layer 172 may be disposed on the pixel electrode 171 and the bank 190. The emissive layer 172 may include an organic material to emit light of a certain color.

For example, the emissive layer 172 may include a hole transporting layer, an organic material layer, and an electron transporting layer.

The common electrode 173 may be disposed on the emissive layer 172. The common electrode 173 may cover the emissive layer 172. The common electrode 173 may be a common layer formed commonly across the first emission area EA1, the second emission area EA2, and the third emission area EA3. A capping layer may be formed on the common electrode 173.

In the top-emission organic light-emitting diode, the common electrode 173 may be formed of a transparent conductive material (TCP) such as, for example, ITO and IZO that can transmit light, or a semi-transmissive conductive material such as, for example, magnesium (Mg), silver (Ag) and an alloy of magnesium (Mg) and silver (Ag). When the common electrode 173 is formed of a semi-transmissive metal material, the light extraction efficiency can be increased by using microcavities.

An encapsulation layer TFEL may be disposed on the common electrode 173. The encapsulation layer TFEL includes at least one inorganic layer, which may prevent permeation of oxygen or moisture into the emission material layer EML. In addition, the encapsulation layer TFEL includes at least one organic layer, which may protect the light-emitting element layer EML from foreign substances such as dust. For example, the encapsulation layer TFEL includes a first inorganic encapsulation layer TFE1, an organic encapsulation layer TFE2 and a second inorganic encapsulation layer TFE3.

The first inorganic encapsulation layer TFE1 may be disposed on the common electrode 173, the organic encapsulation layer TFE2 may be disposed on the first inorganic encapsulation layer TFE1, and the second inorganic encapsulation layer TFE3 may be disposed on the organic encapsulation layer TFE2. The first inorganic encapsulation layer TFE1 and the second inorganic encapsulation layer TFE3 may include multiple layers in which one or more inorganic layers of, for example, a silicon nitride layer, a silicon oxynitride layer, a silicon oxide layer, a titanium oxide layer and an aluminum oxide layer are alternately stacked on one another. The organic encapsulation layer TFE2 may be an organic layer such as, for example, an acryl resin, an epoxy resin, a phenolic resin, a polyamide resin, a polyimide resin, etc.

The touch sensing unit TSU may be disposed on the encapsulation layer TFEL. The touch sensing unit TSU includes a first touch insulating layer TINS1, connection electrodes CE, a second touch insulating layer TINS2, the driving electrodes TE, the sensing electrodes RE, and a third touch insulating layer TINS3.

The first touch insulating layer TINS1 may be formed of an inorganic layer such as, for example, a silicon nitride layer, a silicon oxynitride layer, a silicon oxide layer, a titanium oxide layer, or an aluminum oxide layer.

The connection electrodes CE may be disposed on the first touch insulating layer TINS1. The connection electrode CE may include a single layer or multiple layers of one of, for example, molybdenum (Mo), aluminum (Al), chromium (Cr), gold (Au), titanium (Ti), nickel (Ni), neodymium (Nd) and copper (Cu) or an alloy thereof.

The second touch insulating layer TINS2 is disposed on the first touch insulating layer TINS1 including the connection electrodes CE. The second touch insulating layer TINS2 may be formed of an inorganic layer such as, for example, a silicon nitride layer, a silicon oxynitride layer, a silicon oxide layer, a titanium oxide layer, or an aluminum oxide layer. Alternatively, the second touch insulating layer TINS2 may be formed of an organic layer such as, for example, an acryl resin, an epoxy resin, a phenolic resin, a polyamide resin and a polyimide resin.

The driving electrodes TE and the sensing electrodes RE may be disposed on the second touch insulating layer TINS2. In addition to the driving electrodes TE and the sensing electrodes RE, the dummy patterns DE, the first touch driving lines TL1, the second touch driving lines TL2 and the touch sensing lines RL shown in FIG. 4 may be disposed on the second touch insulating layer TINS1.

The driving electrodes TE, the sensing electrodes RE and the dummy electrodes DE may be implemented as conductive metal electrodes, and may include one of, for example, molybdenum (Mo), aluminum (Al), chromium (Cr), gold (Au), titanium (Ti), nickel (Ni), neodymium (Nd) and copper (Cu) or an alloy thereof. The driving electrodes TE, the sensing electrodes RE and the dummy electrodes DE are formed in a mesh structure or a net structure so that they do not overlap the emission areas EA1 to EA4. Each of the driving electrodes TE and the sensing electrodes RE may overlap some of the connection electrodes BE1 in the third direction (z-axis direction). The driving electrodes TE may be connected to the connection electrodes CE through touch contact holes TCNT1 penetrating through the second touch insulating layer TINS2.

A light-blocking member is applied to the front surface of the second touch insulating layer TINS2 including the driving electrodes TE, the sensing electrodes RE and the dummy electrodes DE. Then, the applied light-blocking member is patterned into the shape of the driving electrodes TE, the sensing electrodes RE and the dummy electrodes DE, and the predetermined plane code shape. For example, the light-blocking member may be formed into code patterns CP and light-blocking dummy patterns DP via exposure and patterning processes using a half-tone mask. To this end, the half-tone mask may include light-shielding portions in line with the positions and shape of the code patterns CP, semi-transmissive portions in line with the shape and positions of the light-blocking dummy patterns DP, and transmissive portions in line with emission areas EA1 to EA4. By the patterning process using the halftone mask, the code patterns CP are formed on the front surfaces of the driving electrodes TE, the sensing electrodes RE and the dummy electrodes DE, and the light-blocking dummy patterns DP are formed at substantially the same time.

The thickness Ph (or height) of the light-blocking dummy patterns DP formed in line with the semi-transmissive portions of the halftone mask is formed within such a predetermined thickness that the light-blocking dummy patterns DP can block light, but are not recognized as a pattern by the touch input device 20. The thickness Ph of the light-blocking dummy patterns DP that allows the light-blocking dummy patterns DP to block the light may be determined based on the use environments such as, for example, the outside brightness of the display device 10, the intensity and the wavelength band of infrared light of the touch input device 20. The width of the code patterns CP may be about equal to the width of the light-blocking dummy patterns DP depending on the width of the touch electrodes SEN.

The thickness Ch (or height) of the code patterns CP is larger than the thickness Ph of the light-blocking dummy patterns DP by a predetermined thickness or more. Accordingly, the code patterns CP have a greater light-blocking rate than the light-blocking dummy patterns DP and are recognized as the code patterns CP by the touch input device 20.

The light-blocking member forming the code patterns CP and the light-blocking dummy patterns DP may be formed of a material including an infrared or ultraviolet absorbing material. For example, the light-blocking members may include a material including an inorganic or organic pigment. Herein, the inorganic pigment may be a pigment containing at least one compound of, for example, carbon black, cyanine, polymethine, anthraquinone, and phthalocyanine-based compounds. The organic pigment may include, but is not limited to, at least one of lactam black, perylene black, and aniline black.

The third touch insulating layer TINS3 is formed on the driving electrodes TE and the sensing electrodes RE including the code patterns CP and the light-blocking dummy patterns DP. The third touch insulating layer TINS3 may provide a flat surface over the driving electrodes TE, the sensing electrodes RE and the connection electrodes BE1, which have different heights. To this end, the third touch insulating layer TINS3 may be formed of an inorganic layer such as, for example, a silicon nitride layer, a silicon oxynitride layer, a silicon oxide layer, a titanium oxide layer, or an aluminum oxide layer. Alternatively, the third touch insulating layer TINS3 may be formed of an organic layer such as, for example, an acryl resin, an epoxy resin, a phenolic resin, a polyamide resin and a polyimide resin.

A plurality of color filter layers CFL1, CFL3 and CFL4 may be formed on the touch sensing unit TSU. For example, a plurality of color filter layers CFL1, CFL3 and CFL4 may be disposed on the third touch insulating layer TINS3 in the form of a plane.

Each of the color filter layers may be formed on the third touch insulating layer TINS3 so that the color filter layers overlap the first to fourth emission areas EA1 to EA4, or may be formed on the second touch insulating layer TINS2 including the driving electrodes TE and the sensing electrodes RE so that the color filter layers overlap the first to fourth emission areas EA1 to EA4. The first color filter CFL1 may be disposed on the first emission area EA1 emitting light of the first color, the second color filter may be disposed on the second emission area EA2 emitting light of the second color, and the third color filter CFL3 may be disposed on the third emission area EA3 emitting light of the third color. In addition, the second color filter may be disposed also on the fourth emission area EA4 that emits light of the second color.

Figure 12:
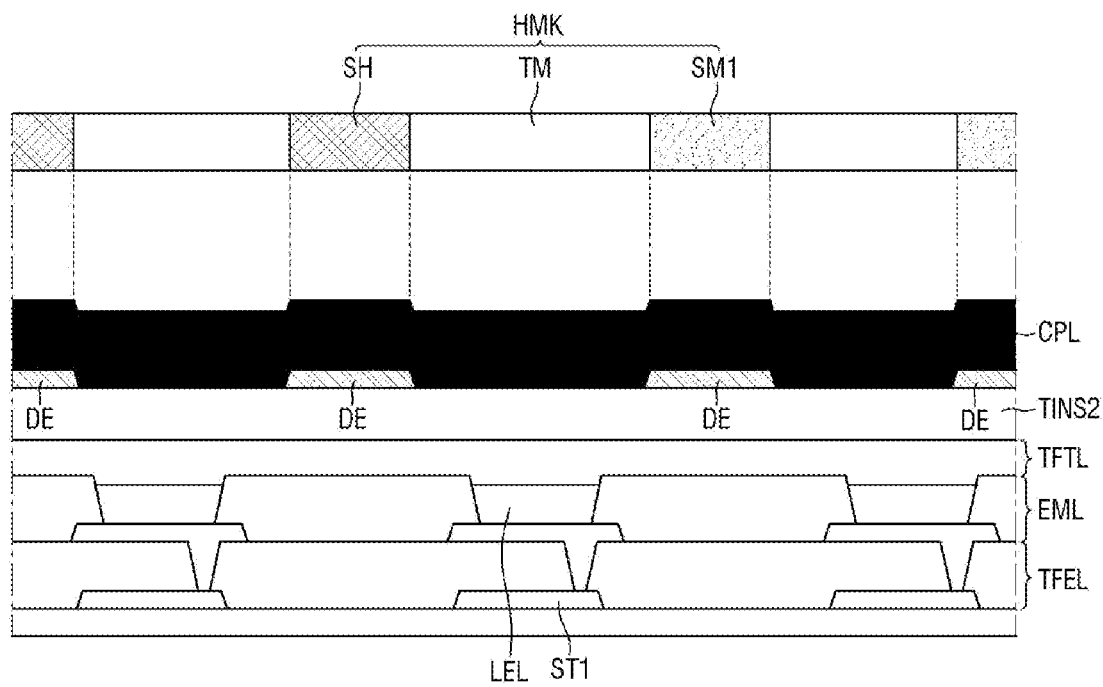
FIG. 12 is a cross-sectional view illustrating processing steps of a method of fabricating the code patterns and the light-blocking patterns shown in FIGS. 10 and 11.

FIG. 12 is a cross-sectional view illustrating processing steps of a method of fabricating the code patterns and the light-blocking patterns shown in FIGS. 10 and 11 according to an embodiment of the present disclosure.

Referring to FIG. 12, a light-blocking member CPL containing inorganic or organic pigments may be applied on the front surface of the second touch insulating layer TINS2 including the driving electrodes TE, the sensing electrodes RE and the dummy electrodes DE.

A halftone mask HMK is placed on the front side of the substrate SUB on which the light-blocking member CPL is applied, which has transmissive portions TM, first semi-transmissive portions SM1, and light-shielding portions SH. The light-shielding portions SH formed in the halftone mask HMK are in line with the shape and positions of the code patterns CP. The first semi-transmissive portions SM1 formed in the halftone mask HMK are in line with the shape and positions of the driving electrodes TE, the sensing electrodes RE and the dummy electrodes DE. The transmissive portions TM formed in the halftone mask HMK are in line with the shape and positions of the emission areas EA1 to EA4.

While the halftone mask HMK is placed, an exposure process is performed for a predetermined period of time. A dry or wet etching process may be performed after the exposure process.

Figure 13:
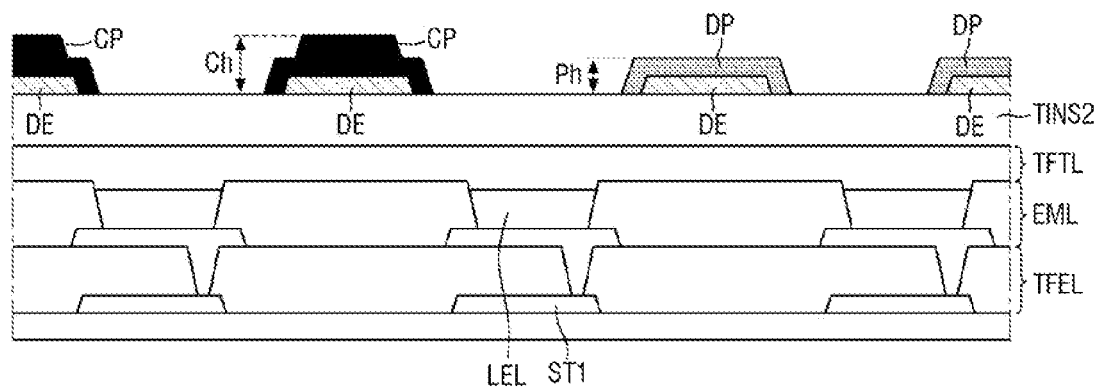
FIG. 13 is a cross-sectional view illustrating a processing step of a method of patterning the code patterns and the light-blocking patterns shown in FIGS. 11 and 12 according to an embodiment of the present disclosure.

FIG. 13 is a cross-sectional view illustrating a processing step of a method of patterning the code patterns and the light-blocking patterns shown in FIGS. 11 and 12 according to an embodiment of the present disclosure.

Referring to FIG. 13, after the light-blocking member CPL is exposed and etched by the halftone mask HMK, light-blocking dummy patterns DP and code patterns CP are formed on the front surfaces of the driving electrodes TE, the sensing electrodes RE and the dummy electrodes DE.

For example, the light-blocking dummy patterns DP are formed on some positions of the front surfaces of the driving electrodes TE, the sensing electrodes RE and the dummy electrodes DE in line with the first semi-transmissive portions SM1 of the halftone mask HMK, with the thickness Ph determined by the light transmittance of the first semi-transmissive portions SM1. The thickness Ph (or height) of the light-blocking dummy patterns DP formed in line with the first semi-transmissive portions SM1 may be within such a predetermined thickness that the light-blocking dummy patterns DP can block light, but are not recognized as a pattern by the touch input device 20.

The code patterns CP are formed on some positions of the front surfaces of the driving electrodes TE, the sensing electrodes RE and the dummy electrodes DE in line with the light-shielding portions SH of the halftone mask HMK, with the thickness Ch determined by the light transmittance of the light-shielding portions SM1. The thickness Ch (or height) of the code patterns CP formed in line with the light-shielding portions SH may be greater than the thickness Ph of the light-blocking dummy patterns DP because the light-shielding portions SH having a lower light transmittance. The code patterns CP may have a higher light-blocking rate than the light-blocking dummy patterns DP and may be recognized as the code pattern CP by the touch input device 20 by lowering the reflectance of infrared light.

The light-blocking member CPL in line with the transmissive portions TM of the half-tone mask HMK is completely removed during an etching process after the exposure. After the light-blocking member CPL is completely removed from the front surfaces of the emission areas EA1 to EA4 in line with the transmission portions TM, the emission areas EA1 to EA4 are exposed on the front side.

The third touch insulating layer TINS3 may be formed on the driving electrodes TE and the sensing electrodes RE including the code patterns CP and the light-blocking dummy patterns DP. The plurality of color filter layers CFL1, CFL3 and CFL4 may be disposed in a plane shape on the third touch insulating layer TINS3.

Figure 14:
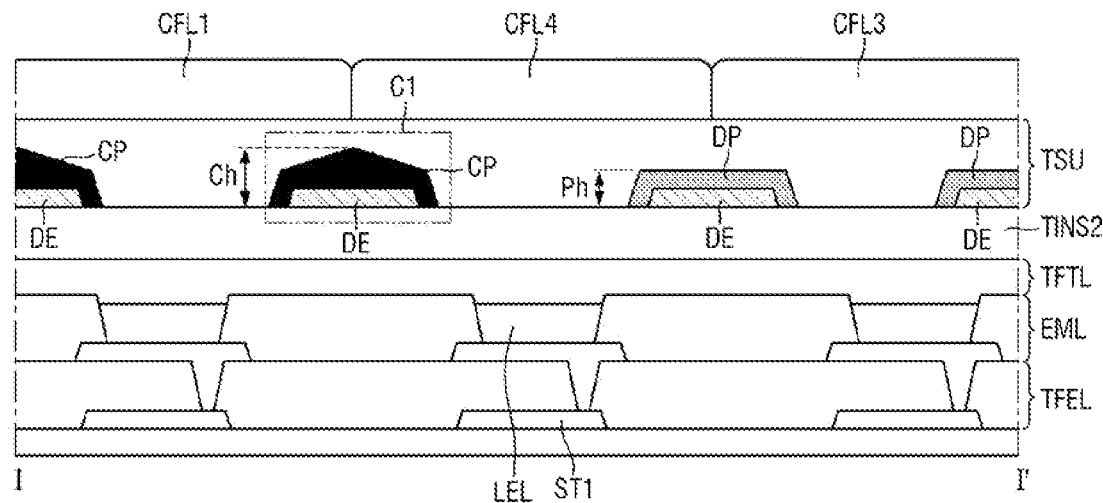
FIG. 14 is a cross-sectional view showing in detail code patterns and light-blocking patterns according to an embodiment of the present disclosure.
Figure 15:
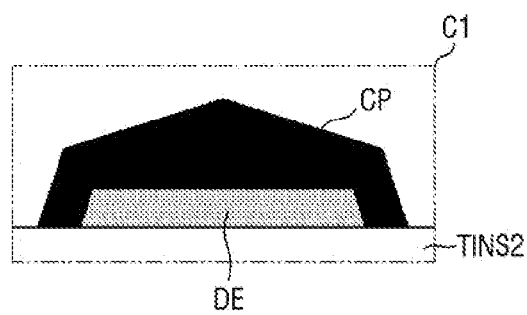
FIG. 15 is an enlarged cross-sectional view showing a cross-sectional structure of a code pattern shown in area Cl of FIG. 14 according to an embodiment of the present disclosure.
Figure 15:
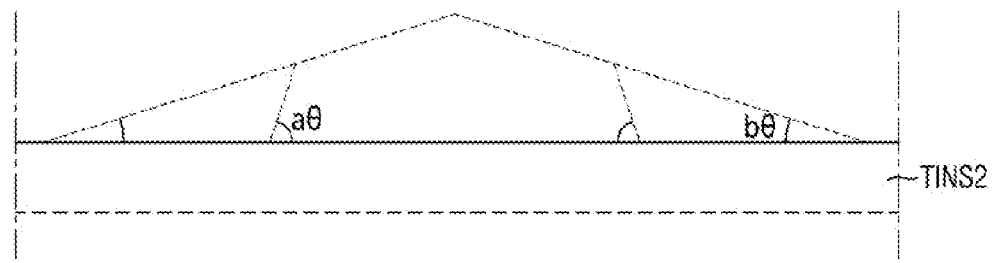

FIG. 14 is a cross-sectional view showing in detail code patterns and light-blocking patterns according to an embodiment of the present disclosure. FIG. 15 is an enlarged, cross-sectional view showing a cross-sectional structure of a code pattern shown in area Cl of FIG. 14 according to an embodiment of the present disclosure.

Referring to FIGS. 14 and 15, by patterning the light-blocking member CPL applied on the driving electrodes TE, the sensing electrodes RE and the dummy electrodes DE, the code patterns CP and light-blocking dummy patterns DP are formed on the driving electrodes TE, the sensing electrodes RE and the dummy electrodes DE.

The thickness Ch (or height) of the code patterns CP is larger than the thickness Ph (or height) of the light-blocking dummy patterns DP, and thus, the code patterns CP have a greater light-blocking rate than the light-blocking dummy patterns DP, so that the code patterns CP are recognized as the code patterns CP by the touch input device 20.

At least one side surface of each of the code patterns CP may be inclined by a first inclination aθ (also referred to as an angle of inclination) with respect to the second touch insulating layer TINS2. The front surface of each of the code patterns CP may be inclined by a second inclination bθ (also referred to as an angle of inclination) with respect to the second touch insulating layer TINS2.

As can be seen from the cross-sectional structure shown in FIG. 15 along the shorter axis of the code patterns CP, the side surfaces and front surfaces of the code patterns CP have slopes of different first and second inclinations aθ and bθ, respectively. Accordingly, infrared light incident from the front side of the code patterns CP may be refracted and diffusely reflected toward the lateral sides of the code patterns CP. Accordingly, the diffuse reflectance of the code patterns CP may be higher than that of the light-blocking dummy patterns DP, and the amount of infrared light reflected from the code patterns CP to the touch input device 20 may be reduced.

As such, the code patterns CP may have a greater refractive index toward the sides than the light-blocking dummy patterns DP. In addition, the code patterns CP may have a greater diffuse reflectance than the light-blocking dummy patterns DP and may be recognized as the code patterns CP by the touch input device 20. As a result, as the diffuse reflectance of the code patterns CP increases, the recognition rate of the code patterns CP recognized by the touch input device 20 can also be increased.

Figure 16:
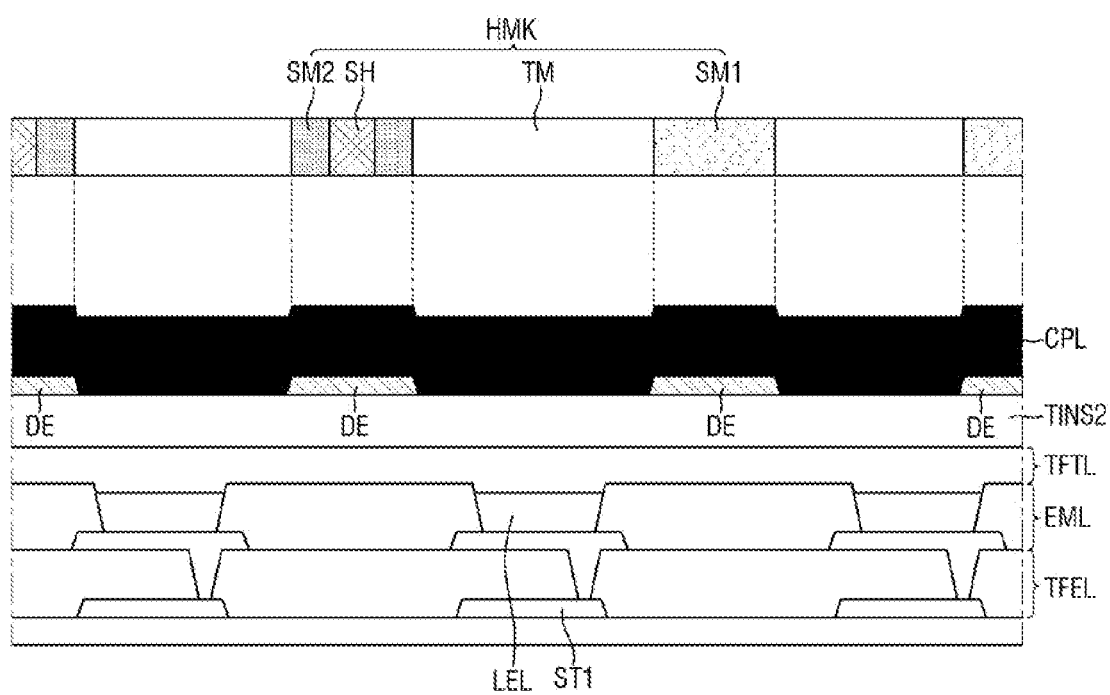
FIG. 16 is a cross-sectional view illustrating processing steps of a method of fabricating the code patterns and the light-blocking patterns shown in FIG. 14.

FIG. 16 is a cross-sectional view illustrating processing steps of a method of fabricating the code patterns and the light-blocking patterns shown in FIG. 14 according to an embodiment of the present disclosure.

Referring to FIG. 16, a light-blocking member CPL containing inorganic or organic pigments may be applied on the front surface of the second touch insulating layer TINS2 including the driving electrodes TE, the sensing electrodes RE and the dummy electrodes DE.

A halftone mask HMK is placed on the front side of the substrate SUB on which the light-blocking member CPL is applied, which has transmissive portions TM, first semi-transmissive portions SM1, second semi-transmissive portions SM2 and light-shielding portions SH.

The second semi-transmissive portions SM2 formed in the halftone mask HMK are located on the both sides of each of the light-shielding portions SH. The second semi-transmissive portions SM2 located on the both sides of each of the light-shielding portions SH may be in line with the shape and the positions of the code patterns CP. The first semi-transmissive portions SM1 formed in the halftone mask HMK are in line with the shape and positions of the driving electrodes TE, the sensing electrodes RE and the dummy electrodes DE. The transmissive portions TM formed in the halftone mask HMK are in line with the shape and positions of the emission areas EA1 to EA4.

While the halftone mask HMK is placed, an exposure process is performed for a predetermined period of time. A dry or wet etching process may be performed after the exposure process.

Figure 17:
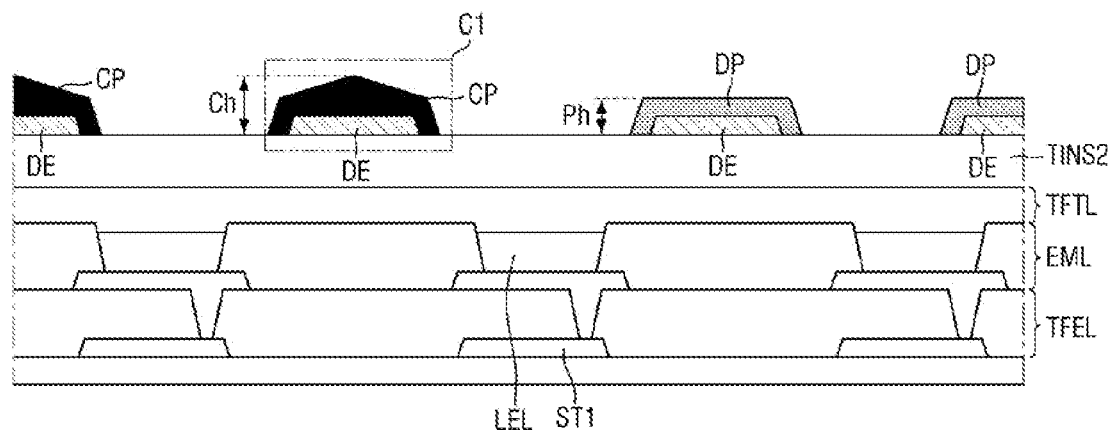
FIG. 17 is a cross-sectional view illustrating processing steps of a method of patterning the code patterns and the light-blocking patterns shown in FIG. 16.

FIG. 17 is a cross-sectional view illustrating processing steps of a method of patterning the code patterns and the light-blocking patterns shown in FIG. 16 according to an embodiment of the present disclosure.

Referring to FIG. 17, the light-blocking member CPL is exposed to light and etched by the halftone mask HMK shown in FIG. 16, so that light-blocking dummy patterns DP and code patterns CP are formed on the front surfaces of the driving electrodes TE, the sensing electrodes RE and the dummy electrodes DE.

For example, the light-blocking dummy patterns DP are formed on some positions of the front surfaces of the driving electrodes TE, the sensing electrodes RE and the dummy electrodes DE in line with the first semi-transmissive portions SM1 of the halftone mask HMK, with the thickness Ph determined by the light transmittance of the first semi-transmissive portions SM1. The thickness Ph (or height) of the light-blocking dummy patterns DP formed in line with the first semi-transmissive portions SM1 may be within such a predetermined thickness that the light-blocking dummy patterns DP can block light but are not recognized as a pattern by the touch input device 20.

Code patterns CP are formed on some positions of the front surfaces of the driving electrodes TE, the sensing electrodes RE and the dummy electrode DE in line with the light-shielding portions SH and second semi-transmissive portions SM2 located on the both sides of each of the light-shielding portions SH, with the thickness Ch determined by the light transmittance of the light-shielding portions SH and the second semi-transmissive portions SM2. The thickness Ch (or height) of the code patterns CP formed in line with the light-shielding portions SH may be greater than the thickness Ph of the light-blocking dummy patterns DP because the light-shielding portions SH having a lower light transmittance. In addition, since the light transmittance of the second semi-transmissive portions SM2 is higher than the light transmittance of the light-shielding portions SH and lower than the light transmittance of the first semi-transmissive portions SM1, slopes having different first and second inclinations aθ and bθ are formed on the side surfaces and the front surface of each of the code patterns CP. Accordingly, the code patterns CP may have a higher diffuse reflectance than the light-blocking dummy patterns DP and may be recognized as the code patterns CP by the touch input device 20 by lowering the reflectance of infrared light on the front side.

The light-blocking member CPL in line with the transmissive portions TM of the half-tone mask HMK is completely removed during an etching process after the exposure. After the light-blocking member CPL is completely removed from the front surfaces of the emission areas EA1 to EA4 in line with the transmission portions TM, the emission areas EA1 to EA4 are exposed on the front side.

The third touch insulating layer TINS3 may be formed on the driving electrodes TE and the sensing electrodes RE including the code patterns CP and the light-blocking dummy patterns DP. The plurality of color filter layers CFL1, CFL3 and CFL4 may be disposed in a plane shape on the third touch insulating layer TINS3.

Figure 18:
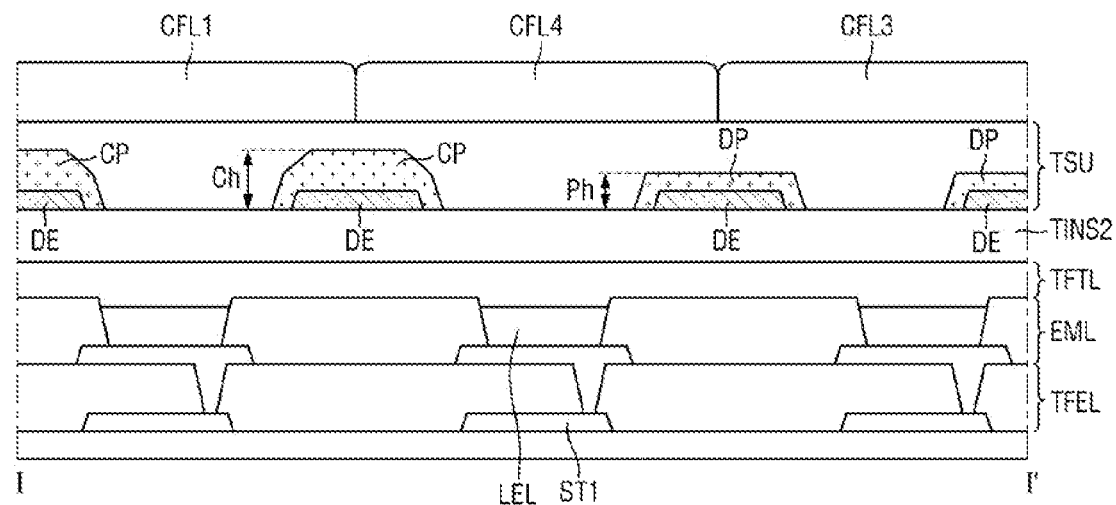
FIG. 18 is a cross-sectional view showing in detail code patterns and light-blocking patterns according to yet an embodiment of the present disclosure.
Figure 19:
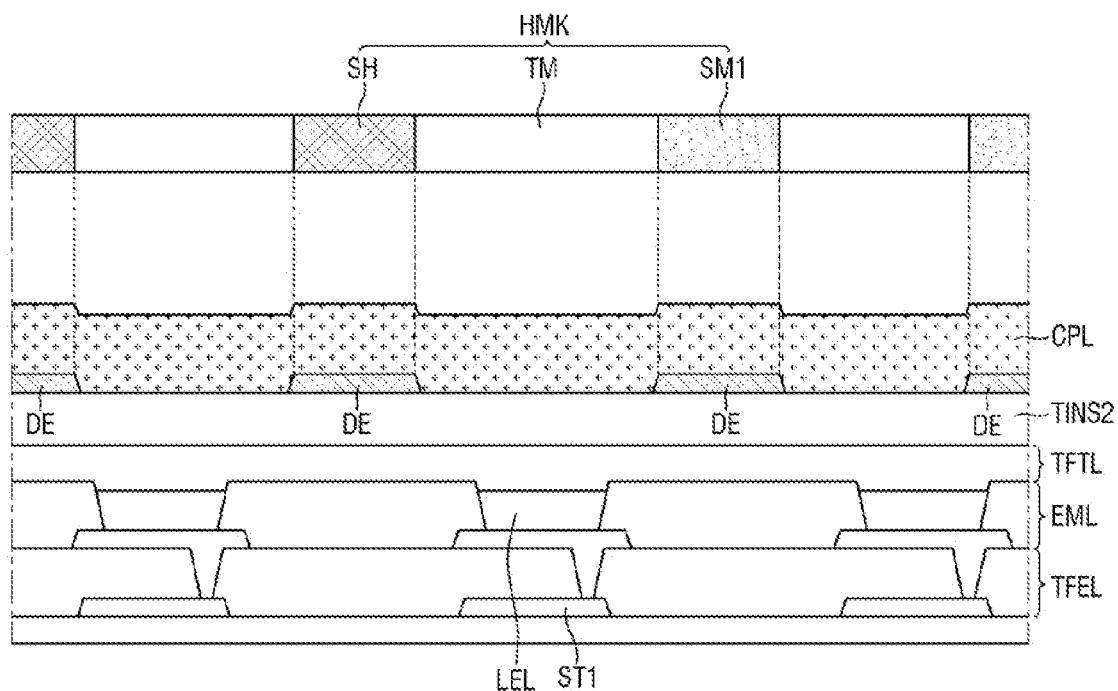
FIG. 19 is a cross-sectional view illustrating processing steps of a method of fabricating the code patterns and the light-blocking patterns shown in FIG. 18 according to an embodiment of the present disclosure.

FIG. 18 is a cross-sectional view showing in detail code patterns and light-blocking patterns according to an embodiment of the present disclosure. FIG. 19 is a cross-sectional view illustrating processing steps of a method of fabricating the code patterns and the light-blocking patterns shown in FIG. 18 according to an embodiment of the present disclosure.

Referring to FIGS. 18 and 19, a light-blocking member CPL including a transparent or semi-transparent pigment may be applied on the front surface of the second touch insulating layer TINS2 including the driving electrodes TE, the sensing electrodes RE and the dummy electrodes DE.

The transparent or semi-transparent pigment may include at least one compound of, for example, cyanine, polymethine, anthraquinone, and phthalocyanine compounds.

Accordingly, the light-blocking member CPL including the transparent or semi-transparent pigment is patterned to form the light-blocking dummy patterns DP and the code patterns CP, and thus, the light-blocking dummy patterns DP and the code patterns CP may be transparent or semi-transparent, including transparent or semi-transparent pigments To expose the light-blocking dummy patterns DP and the code patterns CP to light, a halftone mask HMK is placed on the front side of the substrate SUB on which the light-blocking member CPL is applied, which includes transmissive portions TM, first semi-transmissive portions SM1, second semi-transmissive portions SM2 and light-shielding portions SH.

The second semi-transmissive portions SM2 formed in the halftone mask HMK are located on the both sides of each of the light-shielding portions SH. The second semi-transmissive portions SM2 located on the both sides of each of the light-shielding portions SH may be in line with the shape and the positions of the code patterns CP. The first semi-transmissive portions SM1 formed in the halftone mask HMK are in line with the shape and positions of the driving electrodes TE, the sensing electrodes RE and the dummy electrodes DE. The transmissive portions TM formed in the halftone mask HMK are in line with the shape and positions of the emission areas EA1 to EA4.

While the halftone mask HMK is placed, an exposure process is performed for a predetermined period of time. A dry or wet etching process may be performed after the exposure process.

Figure 20:
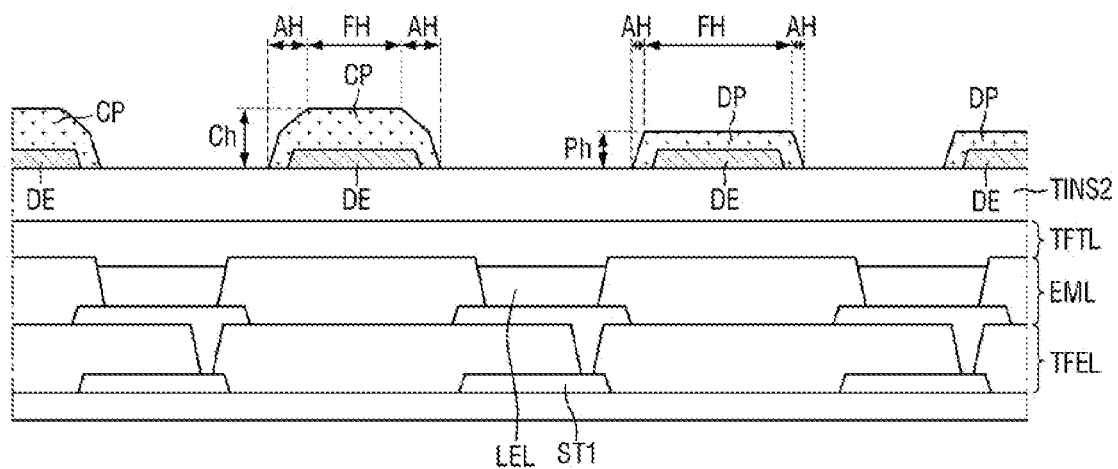
FIG. 20 is a cross-sectional view illustrating processing steps of a method of patterning the code patterns and the light-blocking patterns shown in FIG. 18 according to an embodiment of the present disclosure.

FIG. 20 is a cross-sectional view illustrating processing steps of a method of patterning the code patterns and the light-blocking patterns shown in FIG. 18 according to an embodiment of the present disclosure.

Referring to FIG. 20, the light-blocking member CPL is exposed to light and etched by the halftone mask HMK shown in FIG. 19, so that light-blocking dummy patterns DP and code patterns CP are formed on the front surfaces of the driving electrodes TE, the sensing electrodes RE and the dummy electrodes DE.

For example, the light-blocking dummy patterns DP are formed on some positions of the front surfaces of the driving electrodes TE, the sensing electrodes RE and the dummy electrodes DE in line with the first semi-transmissive portions SM1 of the halftone mask HMK, with the thickness Ph determined by the light transmittance of the first semi-transmissive portions SM1.

Code patterns CP are formed on some positions of the front surfaces of the driving electrodes TE, the sensing electrodes RE and the dummy electrode DE in line with the light-shielding portions SH and second semi-transmissive portions SM2 located on the both sides of each of the light-shielding portions SH. In this instance, since the light transmittance of the second semi-transmissive portions SM2 is higher than the light transmittance of the light-shielding portions SH and lower than the light transmittance of the first semi-transmissive portions SM1, slopes having different first and second inclinations $a\theta$ and $b\theta$ are formed on the side surfaces AH and the front surface FH of each of the code patterns CP.

The light-blocking member CPL in line with the transmissive portions TM of the half-tone mask HMK is completely removed during an etching process after the exposure. After the light-blocking member CPL is completely removed from the front surfaces of the emission areas EA1 to EA4 in line with the transmission portions TM, the emission areas EA1 to EA4 are exposed on the front side.

The third touch insulating layer TINS3 may be formed on the driving electrodes TE and the sensing electrodes RE including the code patterns CP and the light-blocking dummy patterns DP. The plurality of color filter layers CFL1, CFL3 and CFL4 may be disposed in a plane shape on the third touch insulating layer TINS3.

Figure 21:
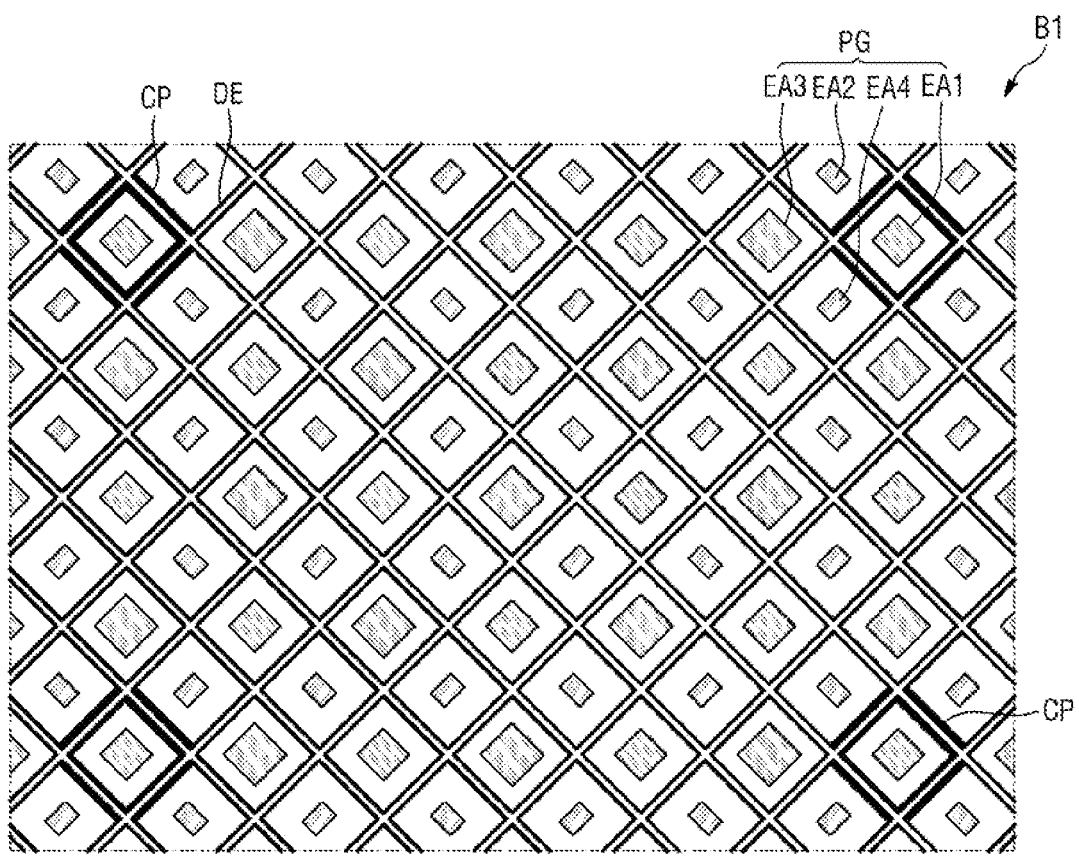
FIG. 21 is an enlarged plan view showing the arrangement of the code patterns and the light-blocking patterns shown in FIGS. 18 and 20 according to an embodiment of the present disclosure.
Figure 21:
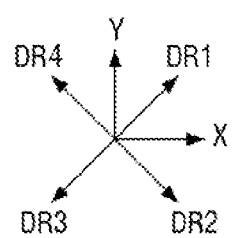

FIG. 21 is an enlarged plan view showing the arrangement of the code patterns and the light-blocking patterns shown in FIGS. 18 and 20 according to an embodiment of the present disclosure.

As shown in FIG. 21, slopes having different first and second inclinations $a\theta$ and $b\theta$ are formed on the side surfaces and front surface of each of the code patterns CP, so that the code patterns CP have a higher diffuse reflectance than the light-blocking dummy patterns DP due to the slopes having the difference first and second inclinations $a\theta$ and WI As a result, the code patterns CP having the slopes with the first and second inclinations $a\theta$ and $b\theta$ are recognized as being dark by the touch input device 20 because the front reflectance of infrared light is low, and can be recognized as the code patterns CP.

For example, even though the light-blocking dummy patterns DP and the code patterns CP are formed to be transparent or semi-transparent as they contain transparent or semi-transparent pigments, the code patterns CP have a higher diffuse reflectance than the light-blocking dummy patterns due to the slopes having the first and second inclinations $a\theta$ and bo. Therefore, the code patterns CP can be recognized by the touch input device 20 as the code patterns CP since they have a lower front reflectance of infrared light.

Figure 22:
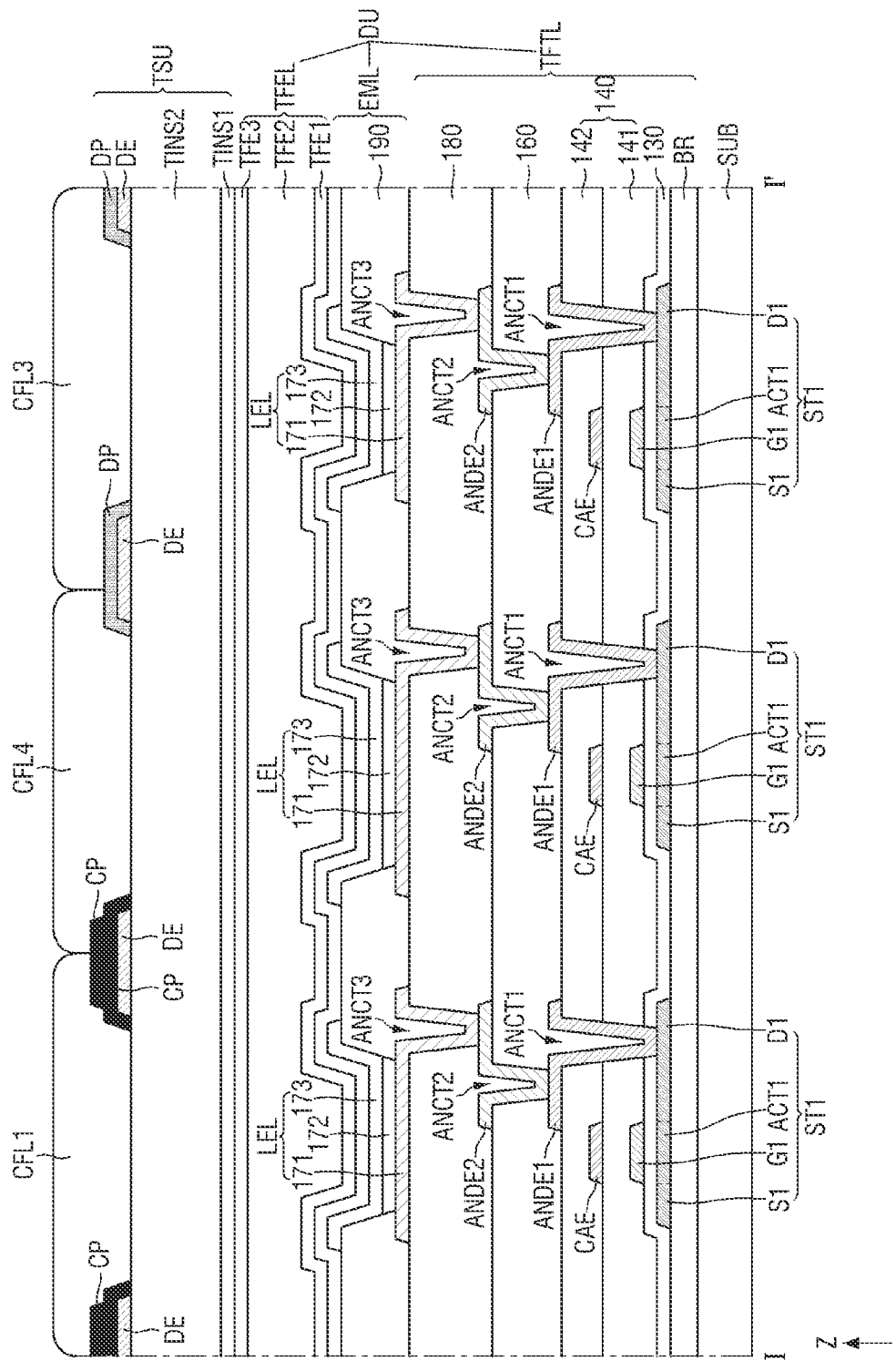
FIG. 22 is a cross-sectional view showing the cross-sectional structure taken along line I-I' of FIG. 9 according to an embodiment of the present disclosure.

FIG. 22 is a cross-sectional view showing the cross-sectional structure taken along line I-I' of FIG. 9 according to an embodiment of the present disclosure.

Referring to FIG. 22, a plurality of color filter layers CFL1, CFL3 and CFL4 may be formed directly on each of the driving electrodes TE and the sensing electrodes RE including the code patterns CP and the light-blocking dummy patterns DP.

For example, a plurality of color filter layers CFL1, CFL3 and CFL4 in a plane shape may be disposed directly on the driving electrodes TE and the sensing electrodes RE including the code patterns CP and the light-blocking dummy patterns DP, without any additional insulating layer being disposed for planarization.

The color filter layers are formed on a second touch insulating layer TINS2 including the driving electrodes TE and the sensing electrodes RE so that they overlap the first to fourth emission areas EA1 to EA4, respectively. The first color filter CFL1 may be disposed on the first emission area EA1 emitting light of the first color, and the second color filter may be disposed on the second emission area EA2 emitting light of the second color. The third color filter CFL3 may be disposed on the third emission area EA3 emitting light of the third color, and the second color filter may be disposed on the fourth emission area EA4 emitting light of the second color.

According to an embodiment of the present disclosure as described above, the display device and the touch input system including the same can generate the touch coordinate data of the touch input device 20 without complicated calculation or correction by way of using the code patterns CP of the display panel 100, and can perform touch input by the touch input device 20. For example, according to embodiments of the present disclosure, touch input features can be performed based on accurate input coordinates, manufacturing costs can be saved, power consumption can be reduced, and the driving process can become more efficient.

In addition, according to the display device according to an embodiment and the touch input system including the same, the recognition rate of the code patterns CP can be increased based on the configuration of the thickness and inclination of the code patterns CP. In addition, as the light-blocking dummy patterns DP are added on the touch electrodes SEN of the display panel 100, the light reflectance on the display panel 100 may be reduced. As a result, the recognition rate and accuracy of the code patterns CP and code information can be increased.

Figure 23:
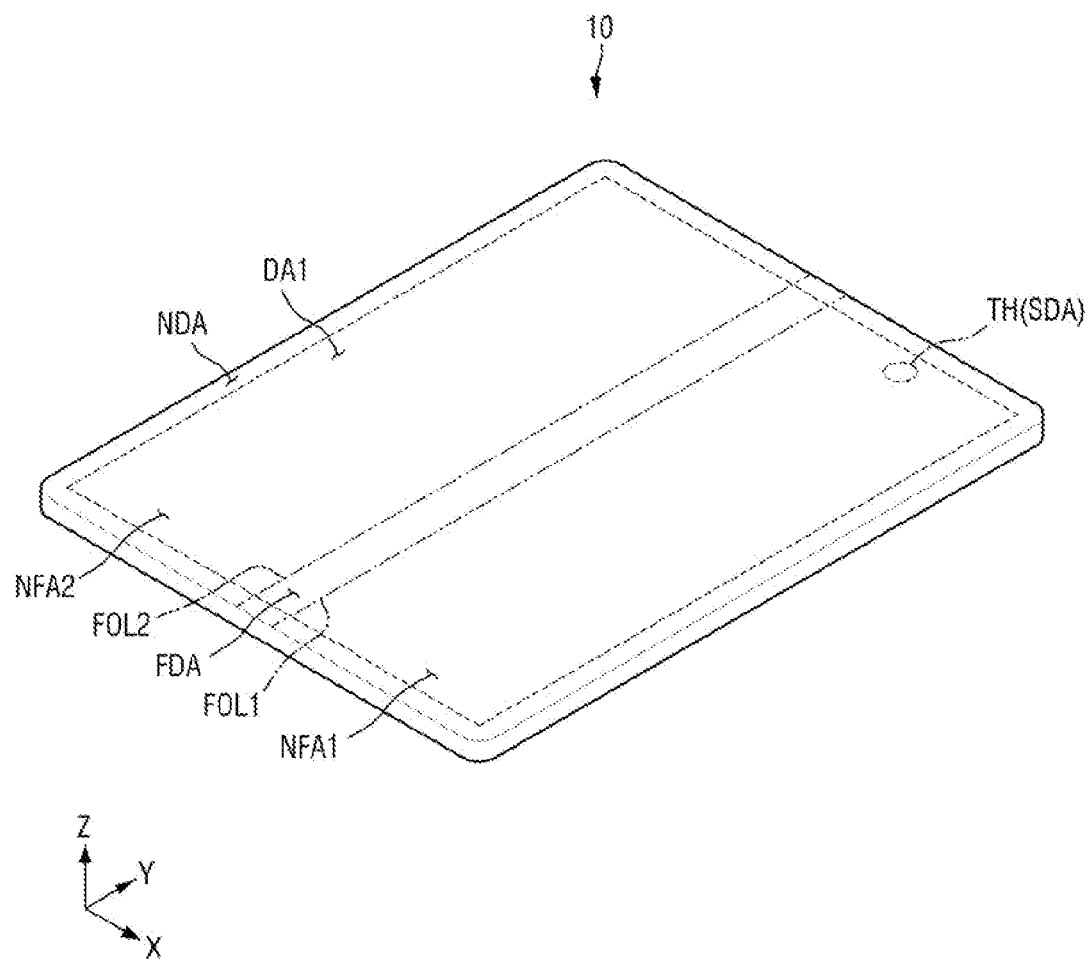
FIGS. 23 and 24 are perspective views showing a display device according to an embodiment of the present disclosure.
Figure 24:
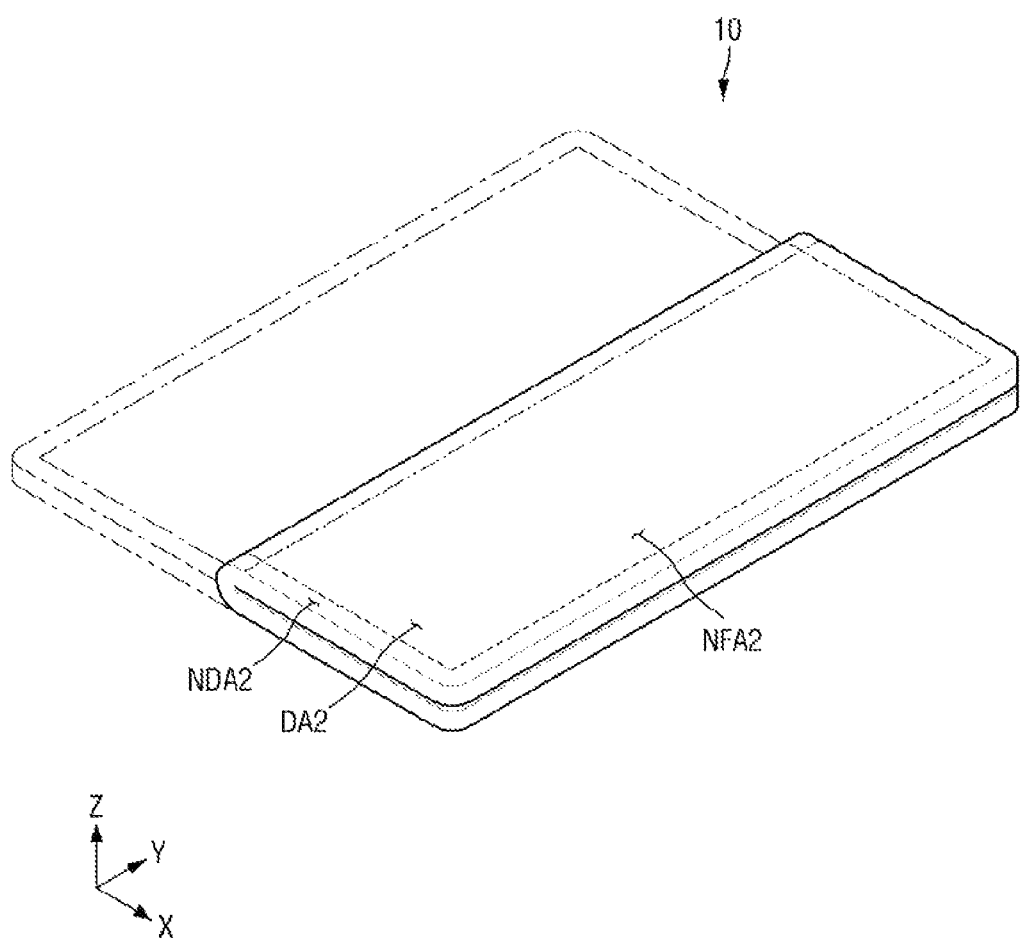

FIGS. 23 and 24 are perspective views showing a display device according to an embodiment of the present disclosure.

In the example shown in FIGS. 23 and 24, a display device 10 is a foldable display device that is folded in the first direction (x-axis direction). The display device 10 may remain folded as well as unfolded. The display device 10 may be folded inward (in-folding manner) such that the front surface is located inside. When the display device 10 is bent or folded in the in-folding manner, a part of the front surface of the display device 10 may face the other part of the front surface. Alternatively, the display device 10 may be folded outward (out-folding manner) such that the front surface is located outside. When the display device 10 is bent or folded in the out-folding manner, a part of the rear surface of the display device 10 may face the other part of the rear surface.

The first non-folding area NFA1 may be disposed on one side, for example, the right side of the folding area FDA. The second non-folding area NFA2 may be disposed on the opposite side, for example, the left side of the folding area FDA. The touch sensing unit TSU according to an embodiment of the present disclosure may be formed and disposed on each of the first non-folding area NFA1 and the second non-folding area NFA2.

The first folding line FOL1 and the second folding line FOL2 may extend in the second direction (y-axis direction), and the display device 10 may be folded in the first direction (x-axis direction). As a result, the length of the display device 10 in the first direction (the x-axis direction) may be reduced to about half, increasing the portability of the display device 10.

The direction in which the first folding line FOL1 and the second folding line FOL2 are extended is not limited to the second direction (y-axis direction). For example, the first folding line FOL1 and the second folding line FOL2 may extend in the first direction (x-axis direction), and the display device 10 may be folded in the second direction (y-axis direction) according to an embodiment. In such a case, the length of the display device 10 in the second direction (y-axis direction) may be reduced to about half. Alternatively, the first folding line FOL1 and the second folding line FOL2 may extend in a diagonal direction of the display device 10 between the first direction (x-axis direction) and the second direction (y-axis direction) according to an embodiment. In such a case, the display device 10 may be folded in a triangle shape.

When the first folding line FOL1 and the second folding line FOL2 extend in the second direction (y-axis direction), the length of the folding area FDA in the first direction (x-axis direction) may be smaller than the length in the second direction (y-axis direction). In addition, the length of the first non-folding area NFA1 in the first direction (x-axis direction) may be larger than the length of the folding area FDA in the first direction (x-axis direction). The length of the second non-folding area NFA2 in the first direction (x-axis direction) may be larger than the length of the folding area FDA in the first direction (x-axis direction).

The first display area DA1 may be disposed on the front side of the display device 10. The first display area DA1 may overlap the folding area FDA, the first non-folding area NFA1, and the second non-folding area NFA2. Therefore, when the display device 10 is unfolded, images may be displayed on the front side of the folding area FDA, the first non-folding area NFA1 and the second non-folding area NFA2 of the display device 10.

The second display area DA2 may be disposed on the rear side of the display device 10. The second display area DA2 may overlap the second non-folding area NFA2. Therefore, when the display device 10 is folded, images may be displayed on the front side of the second non-folding area NFA2 of the display device 10.

Although the through hole TH where a component such as, for example, camera SDA is formed is located in the first non-folding area NFA1 in FIGS. 23 and 24, embodiments of the present disclosure are not limited thereto. For example, in embodiments, the through hole TH or the camera SDA may be located in the second non-folding area NFA2 or the folding area FDA.

Figure 25:
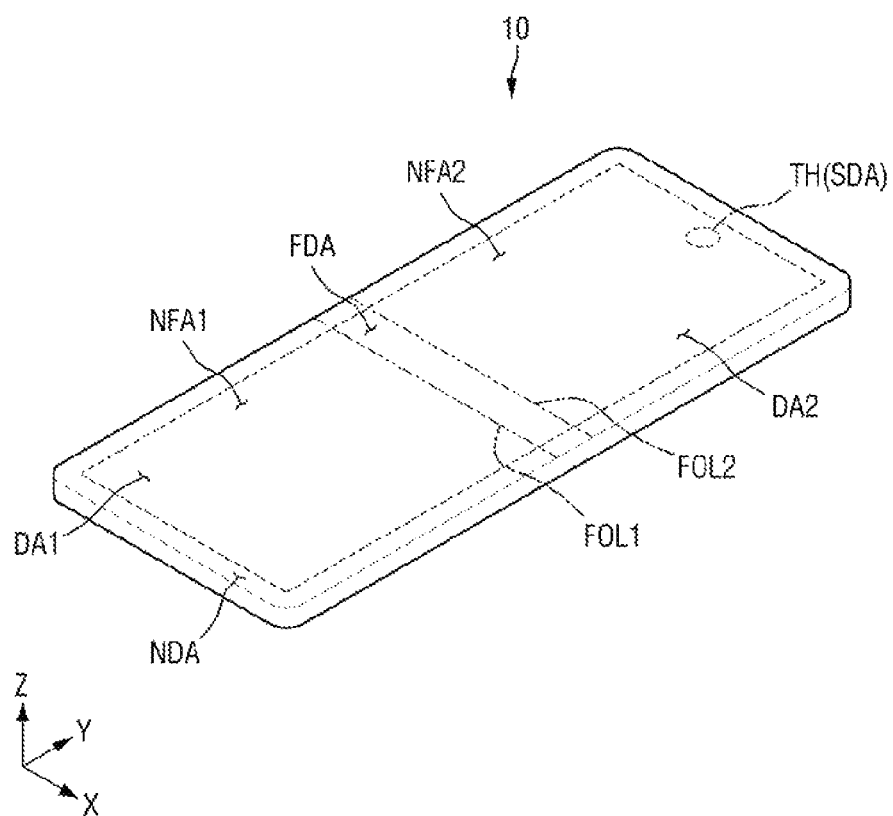
FIGS. 25 and 26 are perspective views showing a display device according to an embodiment of the present disclosure.
Figure 26:
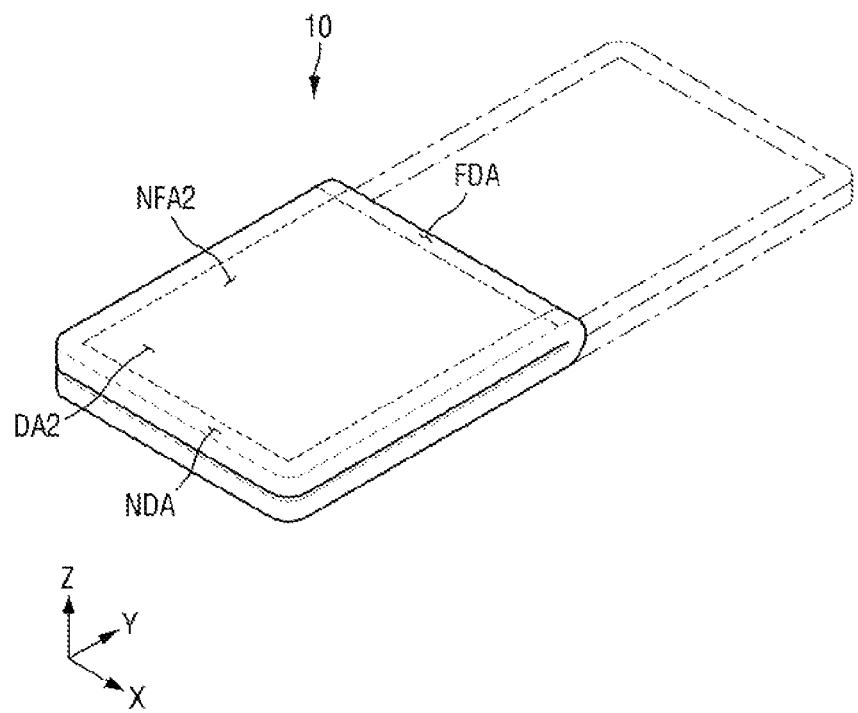

FIGS. 25 and 26 are perspective views showing a display device according to an embodiment of the present disclosure.

In the example shown in FIGS. 25 and 26, a display device 10 is a foldable display device that is folded in the second direction (y-axis direction). The display device 10 may remain folded as well as unfolded. The display device 10 may be folded inward (in-folding manner) such that the front surface is located inside. When the display device 10 is bent or folded in the in-folding manner, a part of the front surface of the display device 10 may face the other part of the front surface. Alternatively, the display device 10 may be folded outward (out-folding manner) such that the front surface is located outside. When the display device 10 is bent or folded in the out-folding manner, a part of the rear surface of the display device 10 may face the other part of the rear surface.

The display device 10 may include a folding area FDA, a first non-folding area NFA1, and a second non-folding area NFA2. The display device 10 can be folded at the folding area FDA, and cannot be folded at the first non-folding area NFA1 and the second non-folding area NFA2. The first non-folding area NFA1 may be disposed on one side, for example, the lower side of the folding area FDA. The second non-folding area NFA2 may be disposed on the other side, for example, the upper side of the folding area FDA.

The touch sensing unit TSU according to an embodiment of the present disclosure may be formed and disposed on each of the first non-folding area NFA1 and the second non-folding area NFA2.

The folding area FDA may be an area bent with a predetermined curvature over the first folding line FOL1 and the second folding line FOL2. Therefore, the first folding line FOL1 may be a boundary between the folding area FDA and the first non-folding area NFA1, and the second folding line FOL2 may be a boundary between the folding area FDA and the second non-folding area NFA2.

The first folding line FOL1 and the second folding line FOL2 may extend in the first direction (x-axis direction) as shown in FIGS. 25 and 26, and the display device 10 may be folded in the second direction (y-axis direction). As a result, the length of the display device 10 in the second direction (the y-axis direction) may be reduced to about half, thus, increasing the portability of the display device 10.

The direction in which the first folding line FOL1 and the second folding line FOL2 are extended is not limited to the first direction (x-axis direction). For example, the first folding line FOL1 and the second folding line FOL2 may extend in the second direction (y-axis direction), and the display device 10 may be folded in the first direction (x-axis direction). In such a case, the length of the display device 10 in the first direction (x-axis direction) may be reduced to about half. Alternatively, the first folding line FOL1 and the second folding line FOL2 may extend in a diagonal direction of the display device 10 between the first direction (x-axis direction) and the second direction (y-axis direction). In such a case, the display device may be folded in a triangle shape.

When the first folding line FOL1 and the second folding line FOL2 extend in the first direction (x-axis direction) as shown in FIGS. 25 and 26, the length of the folding area FDA in the second direction (y-axis direction) may be smaller than the length in the first direction (x-axis direction). In addition, the length of the first non-folding area NFA1 in the second direction (y-axis direction) may be larger than the length of the folding area FDA in the second direction (y-axis direction). The length of the second non-folding area NFA2 in the second direction (y-axis direction) may be larger than the length of the folding area FDA in the second direction (y-axis direction).

The first display area DA1 may be disposed on the front side of the display device 10. The first display area DA1 may overlap the folding area FDA, the first non-folding area NFA1, and the second non-folding area NFA2. Therefore, when the display device 10 is unfolded, images may be displayed on the front side of the folding area FDA, the first non-folding area NFA1 and the second non-folding area NFA2 of the display device 10.

The second display area DA2 may be disposed on the rear side of the display device 10. The second display area DA2 may overlap the second non-folding area NFA2. Therefore, when the display device 10 is folded, images may be displayed on the front side of the second non-folding area NFA2 of the display device 10.

Although the through hole TH where the camera SDA (or another component) is disposed is located in the second non-folding area NFA2 in FIGS. 25 and 26, embodiments of the present disclosure are not limited thereto. For example, in embodiments, the through hole TH may be located in the first non-folding area NFA1 or the folding area FDA.

As is traditional in the field of the present disclosure, embodiments are described, and illustrated in the drawings, in terms of functional blocks, units and/or modules. Those skilled in the art will appreciate that these blocks, units and/or modules are physically implemented by electronic (or optical) circuits such as logic circuits, discrete components, microprocessors, hard-wired circuits, memory elements, wiring connections, etc., which may be formed using semiconductor-based fabrication techniques or other manufacturing technologies. In the case of the blocks, units and/or modules being implemented by microprocessors or similar, they may be programmed using software (e.g., microcode) to perform various functions discussed herein and may optionally be driven by firmware and/or software. Alternatively, each block, unit and/or module may be implemented by dedicated hardware, or as a combination of dedicated hardware to perform some functions and a processor (e.g., one or more programmed microprocessors and associated circuitry) to perform other functions.

While the present disclosure has been particularly shown and described with reference to embodiments thereof, it will be understood by those of ordinary skill in the art that various changes in form and detail may be made therein without departing from the spirit and scope of the present disclosure as defined by the following claims.

What is claimed is:

1. A display device, comprising:
   a display unit comprising a plurality of emission areas;
   a plurality of touch electrodes that sense a touch,
   wherein each of the plurality of touch electrodes comprises at least one portion disposed between adjacent emission areas among the plurality of emission areas;
   a plurality of code patterns that cover a part of a front surface of at least one of the plurality of touch electrodes; and
   a plurality of light-blocking dummy patterns formed on some of the plurality of touch electrodes on which the plurality of code patterns is not formed,
   wherein a thickness of the plurality of code patterns is different from a thickness of the light-blocking dummy patterns, and a light-blocking rate of the plurality of code patterns is different from a light-blocking rate of the light-blocking dummy patterns.

2. The display device of claim 1, wherein the plurality of touch electrodes comprises a plurality of driving electrodes, a plurality of sensing electrodes and a plurality of dummy electrodes, and
   wherein the plurality of driving electrodes, the plurality of sensing electrodes and the plurality of dummy electrodes are formed in a mesh structure between the plurality of emission areas.

3. The display device of claim 2, wherein a shape of each of the plurality of code patterns when viewed in a plan view is one of a closed loop shape of at least one of a rectangle, a square, a circle and a diamond, an open loop shape partially surrounding at least one of the plurality of emission areas, and a straight line shape having a predetermined length.

4. The display device of claim 3, wherein the plurality of code patterns and the plurality of light-blocking dummy patterns comprise an inorganic or organic black pigment that absorbs infrared or ultraviolet light, and cover a part of the front surface and a side surface of the at least one of the plurality of touch electrodes,
   wherein the plurality of code patterns and the plurality of light-blocking dummy patterns do not overlap the plurality of emission areas.

5. The display device of claim 3, wherein the plurality of light-blocking dummy patterns is formed in a mesh shape between the plurality of emission areas such that the plurality of light-blocking dummy patterns and the plurality of code patterns do not overlap the plurality of emission areas.

6. The display device of claim 3, wherein the thickness of the code patterns is greater than the thickness of the light-blocking dummy patterns, and wherein slopes with predetermined inclinations are formed on side and front surfaces of each of the code patterns.

7. The display device of claim 6, wherein each of the light-blocking dummy patterns has a slope on at least one side surface and a flat front surface thereof, and
   wherein each of the code patterns has a first slope with a first inclination on a front surface thereof and has a second slope with a second inclination on at least one side surface thereof.

8. The display device of claim 7, wherein the code patterns have a diffuse reflectance higher than a diffuse reflectance of the light-blocking dummy patterns.

9. The display device of claim 3, wherein a width of the light-blocking dummy patterns is about equal to a width of the code patterns, and
wherein the thickness of the code patterns is greater than the thickness of the light-blocking dummy patterns, and the light-blocking rate of the code patterns is greater than the light-blocking rate of the light-blocking dummy patterns.

10. The display device of claim 9, wherein at least one side surface of each of the code patterns has a slope with a first inclination with respect to a plane, and a front surface of each of the code patterns has a slope with a second inclination with respect to the plane.

11. The display device of claim 9, wherein the code patterns have a side slope with a first inclination, and a front slope with a second inclination, and
wherein the code patterns refract and diffusely reflect infrared light incident from a front side of the code patterns toward other sides of the code patterns.

12. The display device of claim 11, wherein the plurality of code patterns and the plurality of light-blocking dummy patterns comprise transparent or semi-transparent light-blocking members comprising a transparent or semi-transparent pigment.

13. The display device of claim 11, wherein the display device further comprises:
a plurality of color filter layers formed on the plurality of code patterns and the plurality of light-blocking dummy patterns, and covering the plurality of code patterns and the plurality of light-blocking dummy patterns.

14. A touch input system, comprising:
a display device that displays an image; and
a touch input device that receives a touch input,
wherein the display device comprises:
a display unit comprising a plurality of emission areas;
a plurality of touch electrodes that sense a touch, wherein each of the plurality of touch electrodes comprises at least one portion disposed between adjacent emission areas among the plurality of emission areas;
a plurality of code patterns that cover a part of a front surface of at least one of the plurality of touch electrodes; and
a plurality of light-blocking dummy patterns formed on some of the plurality of touch electrodes on which the plurality of code patterns is not formed,
wherein a thickness of the plurality of code patterns is different from a thickness of the light-blocking dummy patterns, and a light-blocking rate of the plurality of code patterns is different from a light-blocking rate of the light-blocking dummy patterns.

15. The system of claim 14, wherein the plurality of touch electrodes comprises a plurality of driving electrodes, a plurality of sensing electrodes and a plurality of dummy electrodes, and
wherein the plurality of driving electrodes, the plurality of sensing electrodes and the plurality of dummy electrodes are formed in a mesh structure between the plurality of emission areas.

16. The system of claim 15, wherein a width of the light-blocking dummy patterns is about equal to a width of the code patterns, and
wherein the thickness of the code patterns is greater than the thickness of the light-blocking dummy patterns, and the light-blocking rate of the code patterns is greater than the light-blocking rate of the light-blocking dummy patterns.

17. The system of claim 15, wherein at least one side surface of each of the code patterns has a slope with a first inclination with respect to a plane, and a front surface of each of the code patterns has a slope with a second inclination with respect to the plane.

18. The system of claim 15, wherein the code patterns have a side slope with a first inclination, and a front slope with a second inclination, and
wherein the code patterns refract and diffusely reflect infrared light incident from a front of the code patterns toward other sides of the code patterns.

19. The system of claim 18, wherein the plurality of code patterns and the plurality of light-blocking dummy patterns comprise transparent or semi-transparent light-blocking members comprising a transparent or semi-transparent pigment.

20. The system of claim 18, wherein the display unit further comprises:
a plurality of color filter layers formed on the plurality of code patterns and the plurality of light-blocking dummy patterns, and covering the plurality of code patterns and the plurality of light-blocking dummy patterns.

* * * * *